(12) United States Patent
Blaum et al.

(10) Patent No.: US 7,019,673 B2
(45) Date of Patent: Mar. 28, 2006

(54) SKEW-TOLERANT GRAY CODES

(75) Inventors: Mario Blaum, San Jose, CA (US);
Bruce Alexander Wilson, San Jose, CA (US)

(73) Assignee: Hitachi Global Storage Technologies-Netherlands, Amsterdam (NL)

( * ) Notice: Subject to any disclaimer, the term of this patent is extended or adjusted under 35 U.S.C. 154(b) by 0 days.

(21) Appl. No.: 11/062,015

(22) Filed: Feb. 18, 2005

(65) Prior Publication Data

US 2005/0206538 A1 Sep. 22, 2005

Related U.S. Application Data

(62) Division of application No. 10/734,943, filed on Dec. 12, 2003, now Pat. No. 6,885,321.

(51) Int. Cl.
*H03M 7/04* (2006.01)

(52) U.S. Cl. .......................... 341/98; 341/97; 341/106

(58) Field of Classification Search ................ 341/98, 341/97, 106, 50; 360/48, 75, 77.08, 49, 40; 711/217–219
See application file for complete search history.

(56) References Cited

U.S. PATENT DOCUMENTS

| | | | | |
|---|---|---|---|---|
| 5,757,567 A | * | 5/1998 | Hetzler et al. | 360/49 |
| 6,274,869 B1 | * | 8/2001 | Butler | 250/338.1 |
| 6,703,950 B1 | * | 3/2004 | Yi | 341/97 |
| 6,762,701 B1 | * | 7/2004 | Jiang | 341/98 |
| 6,879,923 B1 | * | 4/2005 | Butler | 702/104 |

* cited by examiner

*Primary Examiner*—John B Nguyen
(74) *Attorney, Agent, or Firm*—Incaplaw; Terrance A. Meador

(57) ABSTRACT

Skew-tolerant Gray codes have the property that consecutive code words differ in only one co-ordinate position, and the additional property that, in each consecutive group of three consecutive code words, the first and third code words differ in only two adjacent coordinate positions.

18 Claims, 20 Drawing Sheets

| Track Number | Binary Track ID |
|---|---|
| 0 | 0 1 |
| 1 | 1 1 |
| 2 | 1 0 |
| 3 | 0 0 |

FIG. 5A

| Track Number | Binary Track ID |
|---|---|
| 0 | 0 1 1 |
| 1 | 1 1 1 |
| 2 | 1 0 1 |
| 3 | 1 0 0 |
| 4 | 1 1 0 |
| 5 | 0 1 0 |
| 6 | 0 0 0 |
| 7 | 0 0 1 |

FIG. 5B

| Track Number | Original Track Number | Prefix Bit | Original Gray Code | Suffix Bit |
|---|---|---|---|---|
| 7 | 0 | 0 | 01 | 0 |
| 8 | 1 | 0 | 11 | 0 |
| 9 | 2 | 0 | 10 | 0 |
| 10 | 2 | 0 | 10 | 1 |
| 11 | 1 | 0 | 11 | 1 |
| 0 | 0 | 0 | 01 | 1 |
| 1 | 0 | 1 | 01 | 1 |
| 2 | 1 | 1 | 11 | 1 |
| 3 | 2 | 1 | 10 | 1 |
| 4 | 2 | 1 | 10 | 0 |
| 5 | 1 | 1 | 11 | 0 |
| 6 | 0 | 1 | 01 | 0 |

*FIG. 6A*

| Track Number | Binary Track ID |
|---|---|
| 0 | 0 0 1 1 |
| 1 | 1 0 1 1 |
| 2 | 1 1 1 1 |
| 3 | 1 1 0 1 |
| 4 | 1 1 0 0 |
| 5 | 1 1 1 0 |
| 6 | 1 0 1 0 |
| 7 | 0 0 1 0 |
| 8 | 0 1 1 0 |
| 9 | 0 1 0 0 |
| 10 | 0 1 0 1 |
| 11 | 0 1 1 1 |

*FIG. 6B*

| Number of Bits | Number of Codewords | Code Rate |
|---|---|---|
| 1 | 2 | 1 |
| 2 | 4 | 1 |
| 3 | 8 | 1 |
| 4 | 12 | 0.8962 |
| 5 | 32 | 1 |
| 6 | 44 | 0.9099 |
| 7 | 104 | 0.9572 |
| 8 | 140 | 0.8912 |
| 9 | 320 | 0.9247 |
| 10 | 428 | 0.8741 |
| 11 | 968 | 0.9017 |
| 12 | 1292 | 0.8613 |
| 13 | 2912 | 0.8852 |
| 14 | 3884 | 0.8517 |
| 15 | 8744 | 0.8729 |
| 16 | 11660 | 0.8443 |
| 17 | 26240 | 0.8635 |
| 18 | 34988 | 0.8386 |
| 19 | 78728 | 0.856 |
| 20 | 104972 | 0.834 |
| 21 | 236192 | 0.85 |
| 22 | 314924 | 0.8302 |
| 23 | 708584 | 0.845 |
| 24 | 944780 | 0.8271 |

FIG. 7

SKEW-TOLERANT GRAY CODES

Priority is claimed under 35 U.S.C. §120 as a divisional of U.S. patent application Ser. No. 10/734,943, for "SKEW-TOLERANT GRAY CODES", which was filed on Dec. 12, 2003 now U.S. Pat. No. 6,885,321.

This application contains subject matter related to patent application Ser. No. 10/735,541, for "SKEW-TOLERANT GRAY CODE FOR A MOVEABLE OBJECT", which was filed on Dec. 12, 2003.

BACKGROUND OF THE INVENTION

A Gray code is a set of $2^n$ distinct code words, essentially binary numbers, each having n bits. Each bit position of a code word is called a co-ordinate position. Since code words may be digital numbers, each coordinate position may also be called a bit position. Gray codes have the property that consecutive code words differ in only one co-ordinate position. A Gray code is characterized by a transition or code sequence, an ordered list of bit positions manifesting the co-ordinate positions whose values change from one code word to an adjacent code word. A code sequence may be embodied in a code table having rows wherein a row is occupied by a code word having a position in the table corresponding to the position of the code word occupying it in the code sequence.

Gray codes are used to encode the positions of moveable objects such as magnetic disks, optical disks, shafts, periscopes, and so on. (It should be noted that the position of an object is different and distinct from the co-ordinate position of a bit in a code word.) Such a moveable object has a Gray code placed upon it in a discernible form, usually as a sequence of marks that extends in the direction in which the object moves. Each position of the object in the direction of motion has a set of marks that form a code word. The successive positions are marked with the code sequence. As the object moves, successive positions are identified by reading and decoding successive sets of marks. The set of marks for any position differs from the set of marks in an adjacent position only by the value of marks in one co-ordinate position. Gray coding is favored for positional encoding because of the ease, speed and accuracy with which the code words of adjacent positions can be decoded.

A sensor in a system that signals the position of a moveable object with a Gray code includes an array of sensor elements positioned over a surface of the object at which the marks can be read. As the object moves, the sensor discerns the marks at each position and converts the discerned marks to digital electronic form. The form of the marks and the type of sensor used to sense them are selected to be appropriate to the construction of the moveable object. The marks may be magnetic domains, pits, bumps, conductive contacts, colored spaces, and so on. The sensors may be magnetic read heads, optical read heads, magneto-optical read heads, conductive contacts, and so on.

When a sensor is aligned precisely with a coded position, it will faithfully sense the code word at that position. However, at high speeds and high resolutions, it is increasingly possible for a sensor to be called on to operate when it straddles adjacent code words. In such a case, the uncertainty of the result is limited to the co-ordinate position in which the adjacent code words differ. However, the Gray code property that adjacent code words will differ in only one bit position is sufficient to guarantee accurate decoding, particularly as supplemental means may be employed to resolve the uncertainty. Nevertheless, as the speeds of Gray-coded objects increase, along with the resolutions required for high precision position detection, problems of sensing accurately become more acute. If a sensor is skewed with respect to the code words, there is the possibility that it may straddle three or more code words. The Gray code property that adjacent code words will differ in only one bit position is insufficient to guarantee reliable decoding of a sensor signal containing contributions from more than two adjacent positions. A significant enhancement of Gray code accuracy would be realized with the addition of a property that enabled a Gray code to tolerate the skew of a sensor over three or more adjacent code words.

SUMMARY OF THE INVENTION

A skew-tolerant Gray code preserves the property that a only a single co-ordinate position changes value between any two adjacent code words and also adds the property that only two neighboring co-ordinate positions change value between the first and third code words of any group of three successive code words in the code sequence. This additional property ensures that, in the event a Gray code sequence is sensed in a skewed fashion, the code word can still be decoded reliably.

BRIEF DESCRIPTION OF THE DRAWINGS

FIG. 5A is a table containing a code sequence embodying a two-bit skew-tolerant Gray code; FIG. 5B is a table containing a code sequence embodying a four-bit skew-tolerant Gray code.

FIG. 6A is a table illustrating an extension of the two-bit skew-tolerant Gray code of FIG. 5 to a four-bit skew-tolerant Gray code; FIG. 6B is a table containing a code sequence embodying the four-bit skew-tolerant Gray code resulting from the process illustrated in FIG. 6A.

FIG. 7 is a table illustrating the size of skew-tolerant Gray codes generated according to the process illustrated in FIG. 6A.

DETAILED DESCRIPTION

In this description, principles and applications of skew-tolerant Gray codes are set forth. As will be appreciated, the code words of these codes are represented in by discernible marks or patterns of marks on moveable objects, and also by digital numbers. Further, the use of such codes contemplates that the representative form of code words may have multiple manifestations in any particular application. For example, a code sequence may be initially generated as a sequence of electronic digital numbers, converted to magnetically discernible marks in one or more tracks of a hard disk, and then read from the disk and decoded as a sequence of electronic digital numbers. The scope of this description, and the claims which follow it, encompass all representative forms of skew-tolerant Gray codes.

Figure 1B:
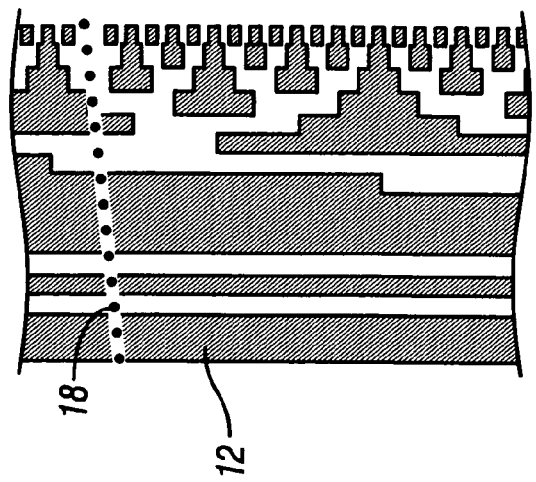
FIG. 1B illustrates a sensor skewed with respect to a Gray-coded pattern.
Figure 1A:
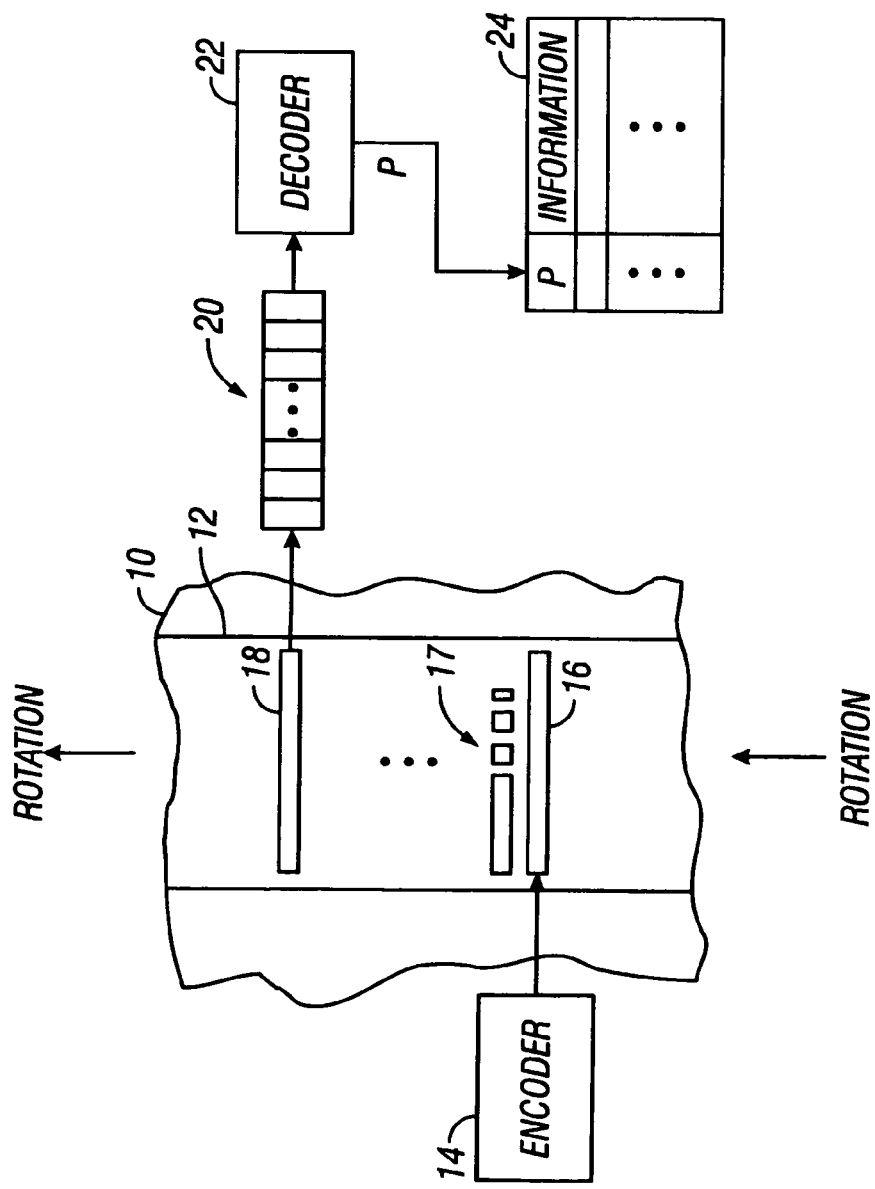
FIG. 1A illustrates a combination for sensing and decoding a code word on a Gray-encoded moveable object in which the sensor is skewed with respect to a code pattern on the object.

Refer to FIG. 1A, which illustrates a combination for sensing and decoding the rotational position of a rotatable shaft 10 employing a Gray code in an encoded shaft portion 12. An encoder 14 is employed initially to generate a code word sequence which is fed, one code word at a time to a code scribe device 16 that places marks corresponding to a code word in the encoded shaft portion 12. A code scribe device may include, for example, an ink jet device or a magnetic write head. In the case of the shaft 10, which is presented only to illustrate this discussion, the Gray code is mapped to a pattern of light and dark bands 17 in the encoded shaft portion 12. Each code word represents a particular angular position of the shaft. In this respect, the skew-tolerant Gray code encodes the shaft's angular positions. As the shaft 10 rotates, the pattern is read by a sensor 18 consisting of a linear array of optical sensor elements. The sensor 18 is connected to a register 20 into which a sequence of code words is stored. The code word currently in the register 20 is provided as an input to a decoder 22. The decoder 22 converts the code word into a parameter p having a value that is, or that corresponds to, the row of a skew-tolerant Gray code sequence where the code word is positioned. In this example, p indexes to the rows of a table 24 where values of angular positions of the shaft 10 are stored, with each angular position value stored in a row of the table corresponding to the skew-tolerant Gray code word at that position on the shaft. When the sensor 18 is properly aligned with the Gray coded pattern, the pattern is faithfully decoded by the decoder 20. However, if, as illustrated in FIG. 1A, the sensor 18 is skewed with respect to the Gray-coded pattern, then the sensed code word will contain bits drawn from two or more neighboring code words. A skew-tolerant Gray code ensures that, provided the sensor 18 is skewed so that the number of code words spanned is fewer than the number of bits spanned, the decoded code word will be one of the code words spanned by the sensor 18.

In the discussion following, an n-bit binary Gray code $C^n$ is an ordered set of all $2^n$ binary strings of length n, $c_0$ through $c_{2^n-1}$. Each of these strings is called a code word. The special property of this ordering is that the Hamming distance between consecutive code words $c_k$ through $c_{2k+1}$ is always exactly 1. That is to say, consecutive code words differ in exactly one coordinate position. Many Gray codes are also cyclic in the sense that the first and last code words differ in exactly one coordinate position.

Gray codes can be constructed inductively by the so called reflective construction. Given an n-bit binary Gray code $C^n$ one may construct an n+1 bit binary Gray code $C^{n+1}$. The Gray code $C^n$ is comprised of code words $c_0^n$ through $c_{N-1}^n$ where $N=2^n$. The first N code words of $C^{n+1}$ are formed by prepending a zero to each codeword of $C^n$. The last N code words of $C^{n+1}$ are formed by prepending a one to each codeword of $C^n$ and reversing the ordering. Thus $$c_{n+1}^k = \begin{cases} [0, c_n^k] & 0 \leq k < N \\ [0, c_n^{2N-k-1}] & N \leq k < 2N \end{cases}$$

The recursion can be started with a 1 bit Gray code comprised of 0 and 1.

Skew-tolerant Gray codes (STGC) have the property that adjacent pairs of code words differ in exactly one coordinate position (like Gray codes which are not skew-tolerant) and the additional property that contiguous triples of code words differ in two adjacent coordinate positions. This means that as a code sequence is traversed from codeword to codeword within a STGC, the bits that are flipping are always close to each other.

Skew-tolerant Gray codes can also be constructed inductively using a modified reflective construction. Given an n-bit binary skew-tolerant Gray code $C^n$ one may construct a n+2 bit binary skew-tolerant Gray code $C^{n+2}$. The skew-tolerant Gray code $C^n$ is comprised of code words $c_0^n$ through $c_{N-1}^n$, where N is less than or equal to $2^n$, such that the leftmost bit changes between $c_0^n$ and $c_1^n$. The largest value M is found such that the rightmost bit changes between $c_{M-2}^n$ and $c_{M-1}^n$. The 4M code words of $C^{n+2}$ are formed by extending the first M code words of $C^n$ by a single bit at each end, with reversals in the order of the code words of $C^n$ as required. Thus:

$$x_k^{n+2} = \begin{cases} [0, c_k^n, 0], & 0 < k \leq M \\ [0, c_{M-k+1}^n, 1], & M < k \leq 2M \\ [1, c_k^n, 1], & 2M < k \leq 3M \\ [1, c_{M-k+1}^n, 0], & 3M < k \leq 4M \end{cases}$$

The last step if the code construction is to apply a cyclic shift to the rows of the extended code X such that in the shifted code $C^{n+2}$ the leftmost bit changes between $c_0^{n+2}$ and $c_1^{n+2}$. A useful algorithm for generating skew-tolerant Gray codes is given later.

INDUSTRIAL APPLICATION

An industrial application of skew-tolerant Gray codes is found in data storage. The following description, which sets forth this application in detail, relates generally to systems in which an encoded pattern of marks are read electronically and decoded to measure the relative position of the read transducer and the pattern of marks. In particular this industrial application relates to magnetic recording hard disk drives, and to pre-recorded servo patterns and servo positioning systems to locate and maintain the read/write heads on the data tracks.

Magnetic recording hard disk drives use a servo-mechanical positioning system to hold the read/write head on the desired data track and to seek from track to track as required to perform read and write operations. Special "servo" patterns are written in circumferentially spaced sectors in each of the concentric data tracks on each disk surface. These patterns are constructed so that the read-back signal from a magnetic read head, as it passes over these patterns, can be decoded to yield the radial position of the head. The servo patterns are written onto the disk during manufacturing in a process known as servowriting.

The radial position of the head is represented as an integer part; the track number, and a fractional part; the position error signal. These parts are usually encoded separately with the track number, recorded in the track ID or TID field and the position error signal recorded in the PES field. The integer track number is represented as a string of binary bits using a Gray code.

When the head is positioned directly over a track, the head produces a read-back signal which is demodulated to obtain the track number of that track. When the head straddles two tracks the read-back signal contains signals from both tracks under the head. The Gray code property ensures that the patterns representing the track numbers of both tracks under the head are the same in all but a single bit position. Thus the read-back signal can be demodulated to obtain all but one of the bits of the track number pattern. The one bit which differs between the two patterns may be ambiguous, however this ambiguity can be resolved using the fractional head position information contained in the position error signal.

When the head is moving quickly in the radial direction the head may traverse more than one track as it crosses the TID field. With each successive generation of hard disk drives the track pitch decreases, the length of the TID field decreases, while the peak seek velocity remains the same or increases slightly. These factors combine to increase the likelihood that the read-back signal from the TID field will contain contributions from three or more tracks. While the properties of the Gray code ensure that a read-back signal containing contributions from the TID fields of two adjacent tracks can be decoded reliably, the Gray code property is not sufficient to guarantee reliable decoding of a read-back signal containing contributions from more than two adjacent tracks.

Figure 1C:
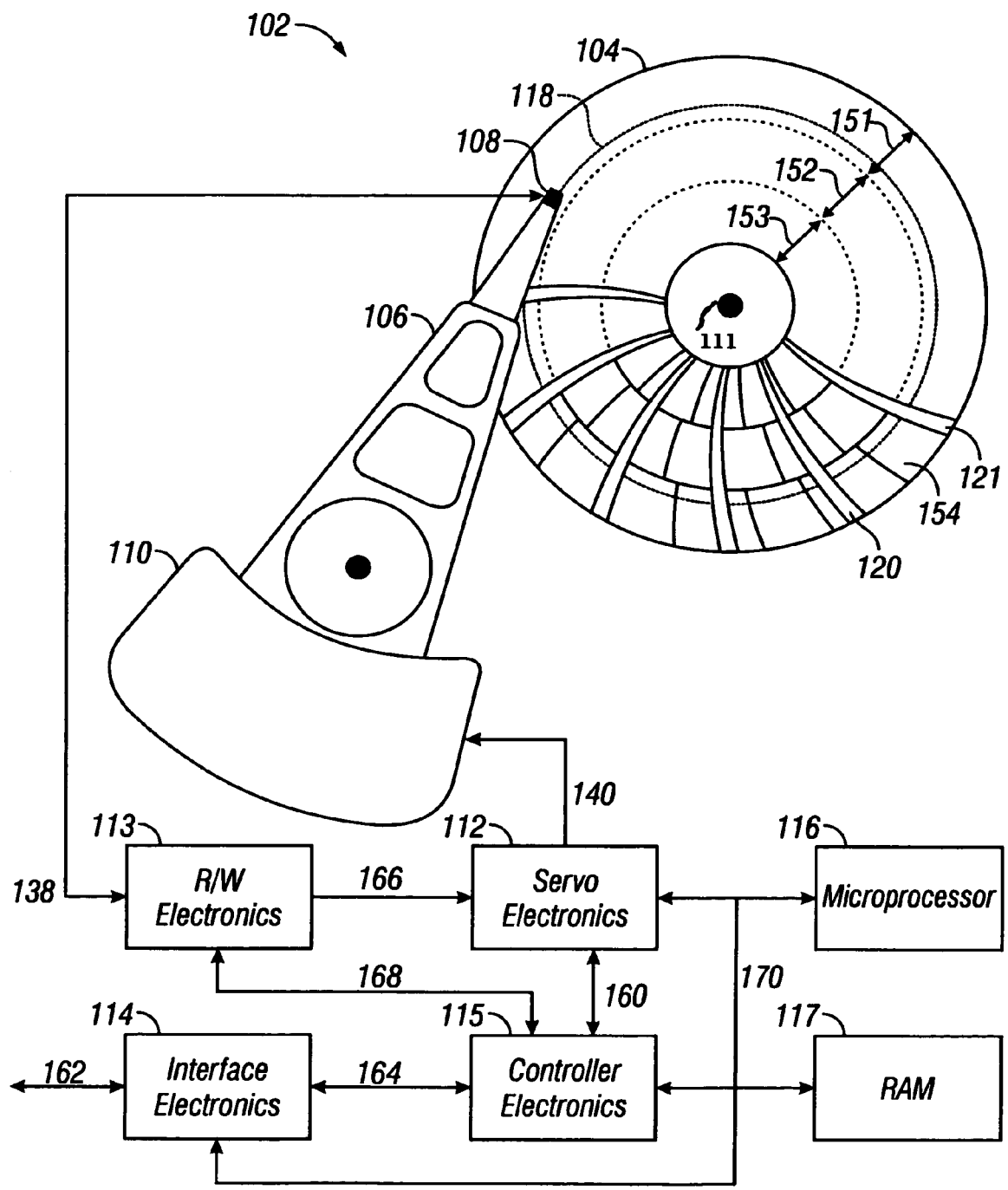
FIG. 1C is a block diagram of a disk drive.

FIG. 1C is a block diagram of a disk drive of the type usable with skew tolerant Gray codes. The disk drive depicted is one that is formatted using a fixed-block "headerless" architecture with sector servo and zone-bit recording (ZBR). The disk drive, designated generally as 102, includes data recording disk 104, actuator arm 106, data recording transducer 108 (also called a recording head or read/write head), voice coil motor 110, servo electronics 112, read/write electronics 113, interface electronics 114, controller electronics 115, microprocessor 116, and RAM 117. The recording head 108 may be an inductive read/write head or a combination of an inductive write head with a magneto-resistive read head. Typically, there are multiple disks stacked on a hub that is rotated by a disk motor, with a separate recording head associated with each surface of each disk. Data recording disk 104 has a center of rotation 111, and is divided for head positioning purposes into a set of radially-spaced tracks, one of which is shown as track 118. The tracks are grouped radially into a number of zones, three of which are shown as zones 151, 152 and 153. The disk contains a plurality of servo sectors 120, which extend across the tracks in a generally radial direction. Each track has a reference index 121 indicating the start of track. Within each zone, the tracks are also circumferentially divided into a number of data sectors 154 where user data is stored. The data sectors contain no data sector identification (ID) fields for uniquely identifying the data sectors so that the drive is considered to have a "No-ID" brand of data architecture, which is also called a "headerless" data architecture. If the disk drive has multiple heads, then the set of tracks which are at the same radius on all disk data surfaces is referred to as a "cylinder".

Read/write electronics 113 receives signals from transducer 108, passes servo information from the servo sectors 120 to servo electronics 112, and passes data signals to controller electronics 115. Servo electronics 112 uses the servo information to produce a current at 140 which drives voice coil motor 110 to position recording head 108. Interface electronics 114 communicates with a host system (not shown) over interface 162, passing data and command information. Interface electronics 114 also communicates with controller electronics 115 over interface 164. Microprocessor 116 communicates with the various other disk drive electronics over interface 170.

In the operation of disk drive 102, interface electronics 114 receives a request for reading from or writing to data sectors 154 over interface 162. Controller electronics 115 receives a list of requested data sectors from interface electronics 114 and converts them into zone, cylinder, head, and data sector numbers which uniquely identify the location of the desired data sectors. The head and cylinder information are passed to servo electronics 112, which is responsible for positioning recording head 108 over the appropriate data sector on the appropriate cylinder. If the cylinder number provided to servo electronics 112 is not the same as the cylinder number over which recording head 108 is presently positioned, servo electronics 112 first executes a seek operation to reposition recording head 108 over the appropriate cylinder.

Once servo electronics 112 has positioned recording head 108 over the appropriate cylinder, servo electronics 112 begins executing sector computations to locate and identify the desired data sector. As servo sectors 120 pass under recording head 108, the servo electronics 112 operates to identify each servo sector. One illustrative way to identify servo sectors is the headerless architecture method described in U.S. Pat. No. 5,615,190. In brief, a servo timing mark (STM) is used to locate servo sectors, and a count of STMs from a servo sector containing an index mark 121 uniquely identifies each servo sector. Additional information is maintained in association with servo electronics 112 and controller electronics 115 for controlling the read or writing of data in the data sectors.

Figures 2A, 2B:
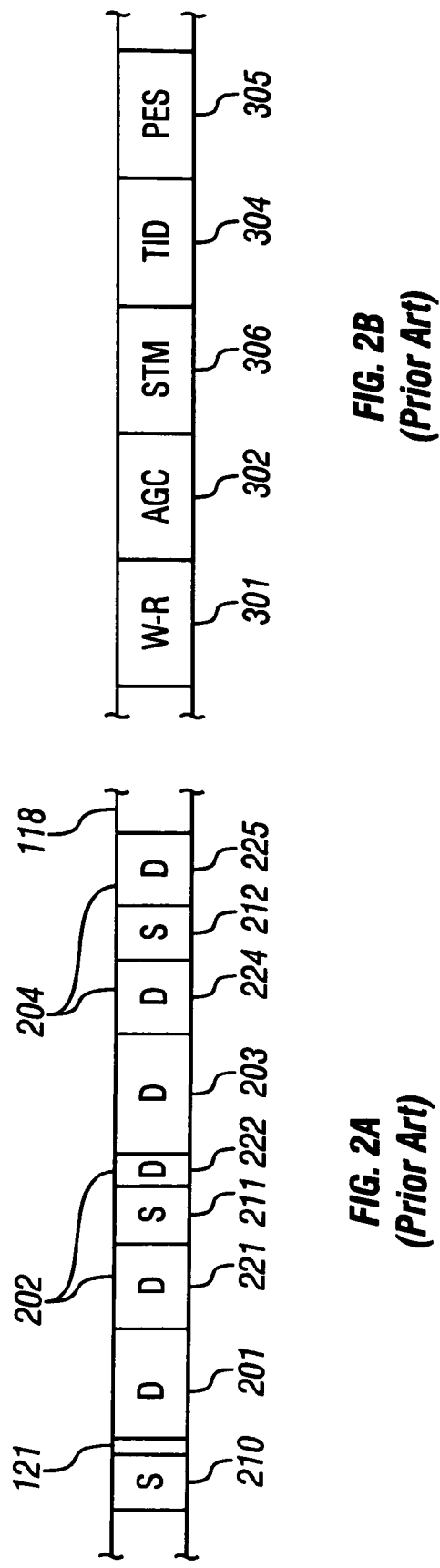
FIG. 2A illustrates a portion of a track on a disk.
FIG. 2B is an expanded view of a servo sector.

Referring now to FIG. 2A, a portion of a typical track 118 on the disk 104 is shown expanded. Four complete data sectors are shown (201, 202, 203 and 204). Three representative servo sectors 210, 211, and 212 are also shown. As can be seen from this example, some data sectors are split by servo sectors, and some data sectors do not start immediately following a servo sector. For example, data sectors 202 and 204 are split by servo sectors 211 and 212, respectively. Data sector 202 is split into data sections 221 and 222, and data sector 204 is split into data sections 224 and 225. Data sector 203 starts immediately after the end of data sector 202, rather than immediately following a servo sector. The index mark 121 indicates the beginning of the track and is shown contained in servo sector 210. FIG. 2B is an expanded view of one of the servo sectors illustrated in FIG. 2A. Typically, each servo sector contains an STM 306. The STM 306 serves as a timing reference for reading the subsequent servo information in track identification (TID) field 304 and position error signal (PES) field 305. The STM is sometimes also referred to as a servo address mark or servo start mark.

Figure 3:
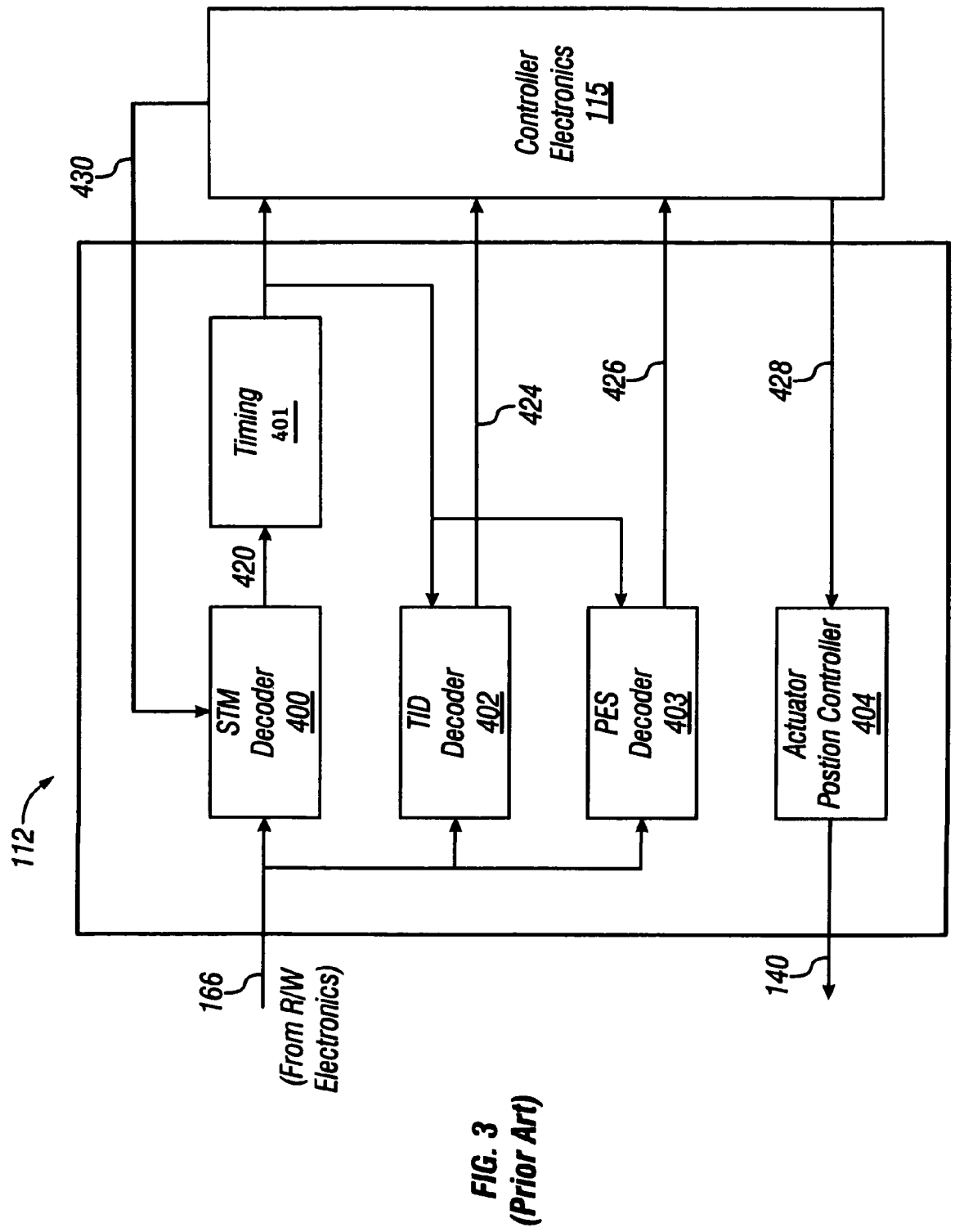
FIG. 3 is a block diagram of servo electronics.

FIG. 3 is a block diagram of the servo electronics 112. In operation, controller electronics 115 provides input to actuator position control 404, which in turn provides a signal 140 to the actuator to position the head. The controller electronics 115 uses the servo information read from the servo sectors to determine the input 428 to the actuator position control 404. The servo information is read by the read/write electronics 113 (FIG. 1B), and signals 166 are input to the servo electronics 112. STM decoder 400 receives a clocked data stream 166 as input from the read/write electronics 113, and a control input 430 from the controller electronics 115. Once an STM has been detected, an STM found signal 420 is generated. The STM found signal 420 is used to adjust timing circuit 401, which controls the operating sequence for the remainder of the servo sector, and is also sent to controller electronics 115.

After detection of an STM, the track identification (TID) decoder 402 receives timing information 422 from timing circuit 401, reads the clocked data stream 166, which is typically Gray-code encoded, and then passes the decoded TID information 424 to controller electronics 115. Subsequently, PES decode circuit 403 captures the PES signal from read/write electronics 166, then passes position information 426 to controller electronics 115. Inputs to the PES decode circuit 403 are typically analog, although they may be digital or of any other type. The PES decode circuit 403 need not reside within the servo electronics module 112.

Figure 4:
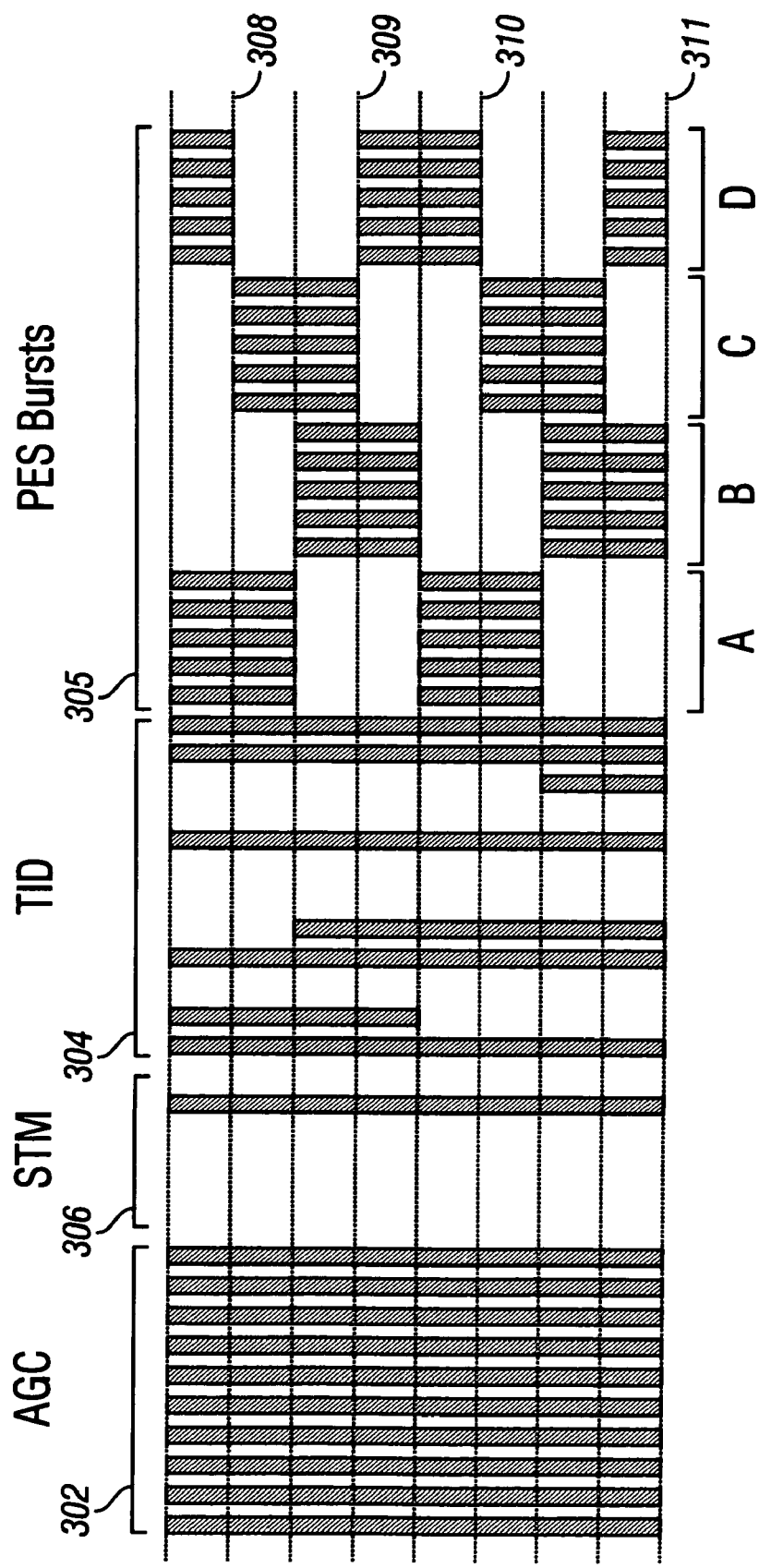
FIG. 4 is a schematic of a Gray-coded quad-burst servo pattern.

FIG. 4 is a schematic of a quad-burst servo pattern used in sector servo systems and shows a greatly simplified pattern for clarity with only four tracks (shown with track centerlines 308, 309, 310 and 311). The two possible magnetic states of the medium are indicated as black and white regions. In the case of all servo patterns the actual pattern extends over hundreds of thousands of tracks from the disk ID to OD.

The servo pattern is comprised of four distinct fields: AGC field 302, STM field 306, Track ID field 304 and PES bursts A–D. The automatic gain control (AGC) field 302 is a regular series of transitions and is nominally the same at all radial positions. The AGC field 302 allows the servo controller to calibrate timing and gain parameters for later fields. The STM field 306 is the same at all radial positions. The STM pattern is chosen such that it does not occur elsewhere in the servo pattern and does not occur in the data records. The STM is used to locate the end of the AGC field and to help locate the servo pattern when the disk drive is initialized. The TID field 304 contains the track number, usually Gray-coded and stored in dibit encoded format. The TID field 304 determines the integer part of the radial position. The position error signal (PES) bursts A–D are used to determine the fractional part of the radial position. Each PES burst comprises a series of regularly spaced transitions. The PES bursts are arranged radially such that a burst of transitions are one track wide and two tracks apart, from center to center. PES bursts are offset from their neighbors such that when the head is centered over an even-numbered track (e.g., track with center 310) the read-back signal from burst A is maximized, the read-back signal from burst B is minimized and the read-back signal from bursts C and D are equal. As the head moves off-track in one direction the read-back signal from burst C increases and the read-back signal from burst D decreases until, with the head half-way between tracks the read-back signal from burst C is maximized, read-back signal from burst D is minimized and read-back signals from bursts A and B are equal. As the head continues to move in the same direction the read-back signal from burst B increases and the read-back signal from burst A decreases until, with the head centered over the next track (with an odd track number, e.g. track with center 311) the read-back signal from burst B is maximized, the read-back signal from burst A is minimized and the read-back from signals from bursts C and D are again equal.

As set out above, skew-tolerant Gray codes are constructed recursively, starting with a short code and repeatedly extending the code to generate longer and longer codes until the desired code length is obtained. FIG. 5A tabulates the code word entries for the simplest code in this class of codes. In this disk drive application, each code in the class of skew-tolerant Gray codes represents a mapping from a sequence of integer track numbers to a sequence of binary strings. The FIG. 5A table includes major columns labeled Track Number and Binary Track ID. As required only one bit in the binary string changes as we move from row to row, furthermore in any set of three contiguous rows the two bits which change are neighbors. The code can be considered to be cyclic such that the last row in the table wraps around to the first row in the table with the required properties preserved. Thus there exist a number of equivalent codes differing only in that the mapping from Track Number to Binary Track ID is cyclically shifted. For the purposes of simple notation it is required that the leftmost bit of the Binary Track ID must change between Track Number 0 and Track Number 1. Furthermore, a special group of rows is denoted at the bottom of the code table, indicated in gray, which are part of the code but which will be discarded when extending the code. These rightmost bit changes between the penultimate and ultimate rows of the main code table, in this case between rows 1 and 2.

FIG. 5B tabulates the code word entries for a three bit skew-tolerant Gray code. Once again only one bit in the binary string changes as the code sequence is traversed from code word to adjacent code word and in any set of three contiguous code words the two bits which change are neighbors. In this regard observe that only the middle bit changes between the code words for Track 1 and Track 2, while only the middle and right bits change between the code words for Track 1 and Track 3. Observe further that the leftmost bit of the Binary Track ID changes between Track Number 0 and Track Number 1 and that the rightmost bit changes between Track Number 6 and Track Number 7. In this special case no rows must be discarded when extending the code. By extending these two simple skew-tolerant Gray codes a skew-tolerant Gray code of any required length may be obtained. If the application requires a skew-tolerant Gray code with an even number of bits, code generation starts with the 2-bit skew-tolerant Gray code, conversely if the application requires a skew-tolerant Gray code with an odd number of bits, code generation starts with the 3-bit skew-tolerant Gray code. The procedure for extending the code is the modified reflective construction which is described above.

FIG. 6A illustrates the process of extending the 2-bit skew-tolerant Gray code shown in FIG. 5A to form a 4-bit skew-tolerant Gray code. The FIG. 6A table includes major columns labeled Track Number, Original Track Number, Prefix Bit, Original Gray Code and Suffix Bit. Examining the code table shown in FIG. 5A one observes that the rightmost bit changes between row 1 and row 2 thus M=3 in this example. The first 3 rows of FIG. 5A are extended by adding a binary 0 to the beginning and end of the Binary Track ID to form the first 3 rows of the extended code. Next the first 3 rows of FIG. 5A are taken in reverse order and extended by adding a binary 0 to the beginning and a binary 1 to the end of the Binary Track ID to form rows 4 through 6 of the extended code. Then the first 3 rows of FIG. 5A are extended by adding a binary 1 to the beginning and end of the Binary Track ID to form rows 7 through 9 of the extended code. Finally the first 3 rows of FIG. 5A are taken in reverse order and extended by adding a binary 1 to the beginning and a binary 0 to the end of the Binary Track ID to form the last 3 rows of the extended code. Now the last row is found in which the leftmost (prefix) bit is 0 and this row is labelled Track Number 0.

FIG. 6B tabulates the codeword entries for the 4-bit skew-tolerant Gray code that results from the process illustrated in FIG. 6A. This table also illustrates the properties of a skew-tolerant Gray code. In this regard, observe that the code words for Track 4 and Track 5 differ only in the next-to-rightmost bit, while the code words for Track 4 and Track 6 differ only in the rightmost two bits. Note also that since the rightmost bit of the Binary Track ID changes between Track Number 9 and Track Number 10 Track Number 11 will not be used when this code is extended to form a 6-bit skew-tolerant Gray code.

It is worth noting that given a single skew-tolerant Gray code a number of entirely equivalent codes can be generated by applying one or more of the following transformations: the entire Binary Track ID column can be flipped top for bottom or left for right, each Binary Track ID can be added modulo 2 (XORed) with a fixed binary string of the same length.

FIG. 7 tabulates the size of the Skew-Tolerant Gray Codes formed in this manner. The FIG. 7 table includes major columns labeled Number of Bits, Number of Code words and Code Rate.

Figure 8:
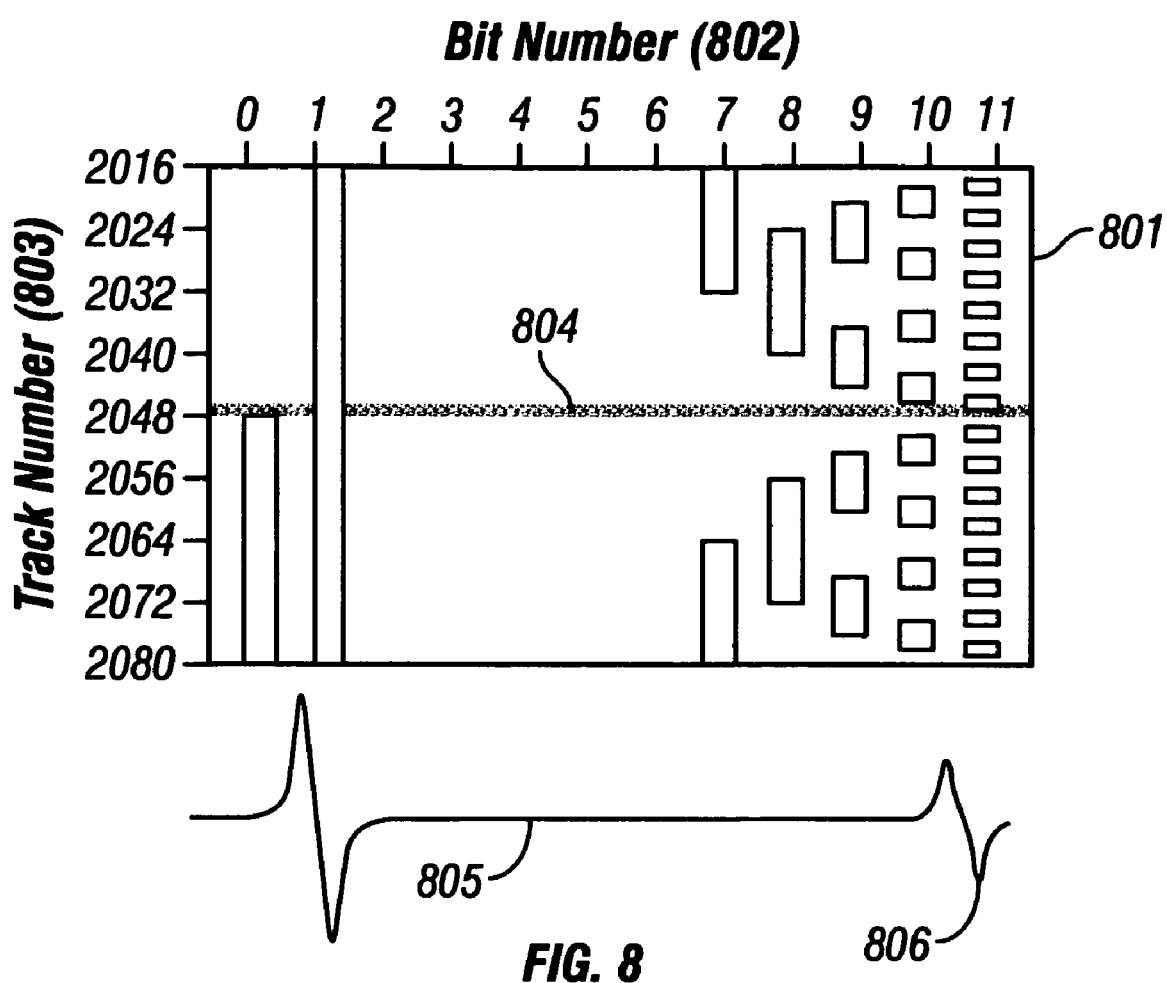
FIG. 8 is an illustration of a read back signal produced by a read head straddling two code words.

FIG. 8 illustrates the benefit of the Gray code property when the Track ID is read-back with the head straddling two tracks. The figure shows the Track ID field (801) for a span of 64 tracks of a Gray coded Track ID with 12 bits. The bit number (802) and track number (803) are indicated and the two possible magnetic states of the medium are denoted as black and white. The path of the head across the Track ID field is indicated by a gray stripe (804) and the resulting read-back signal is shown (805). Where the Binary Track ID is different between the two tracks under the head the head will register a weak read-back dipulse (806). This weak dipulse (806) will be ambiguously detected. Because of the Gray code properties the two Binary Track IDs under the head differ in only a single bit and thus there can be no more than one ambiguous dibit. The resulting ambiguity is thus restricted to only one of two possible values and the position error signal information is sufficient to resolve this ambiguity.

Figure 9A:
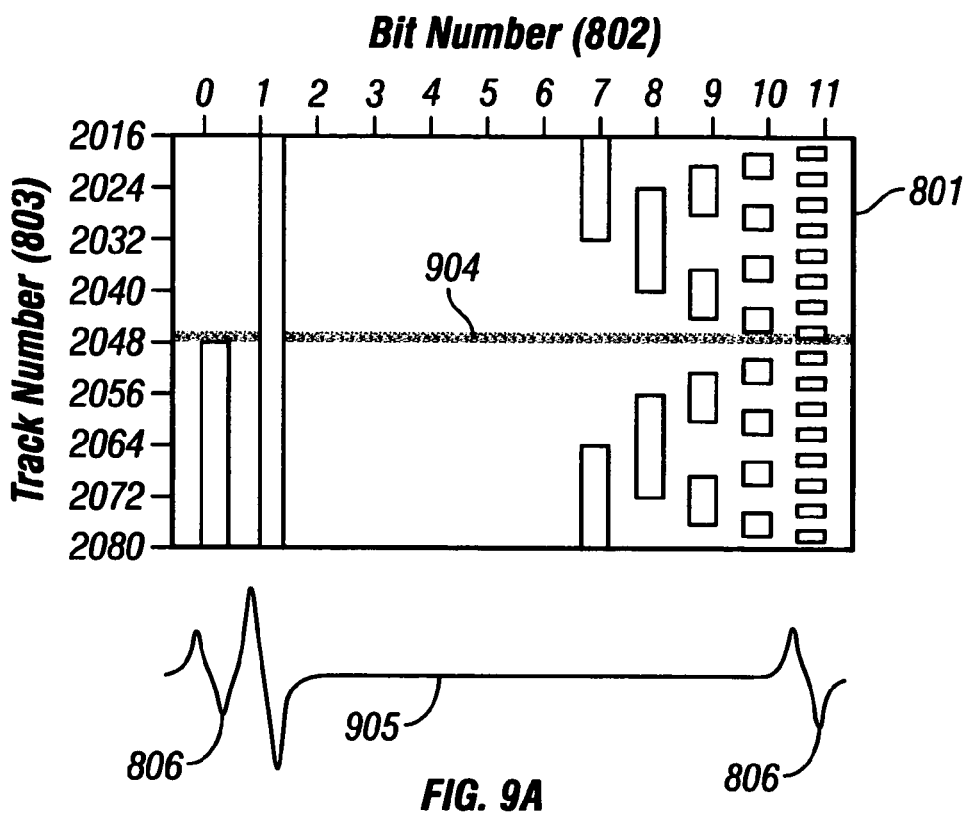
FIG. 9A is an illustration of a read back signal produced by a skewed read head sensing a skew-intolerant Gray code.

FIG. 9A shows why the Gray code property is not sufficient to guarantee reliable detection if the head traverses the Track ID field at an angle due to high radial velocity during a seek. The figure shows the Track ID field (801) for a span of 64 tracks of a Gray coded Track ID with 12 bits. The bit number (802) and track number (803) are indicated and the two possible magnetic states of the medium are denoted as black and white. The path of the head across the Track ID field is indicated by a gray stripe (904) and the resulting read-back signal is shown (905). The radial velocity of the head is sufficient that as the head traverses the Track ID field the head reads a portion of three distinct tracks. As a result in some cases the read-back signal (905) shows two weak dibits (806). The resulting ambiguity cannot be resolved by the Position Error Signal and as a result the head position will at best be resolved only approximately and, at worst may be resolved incorrectly.

Figure 9B:
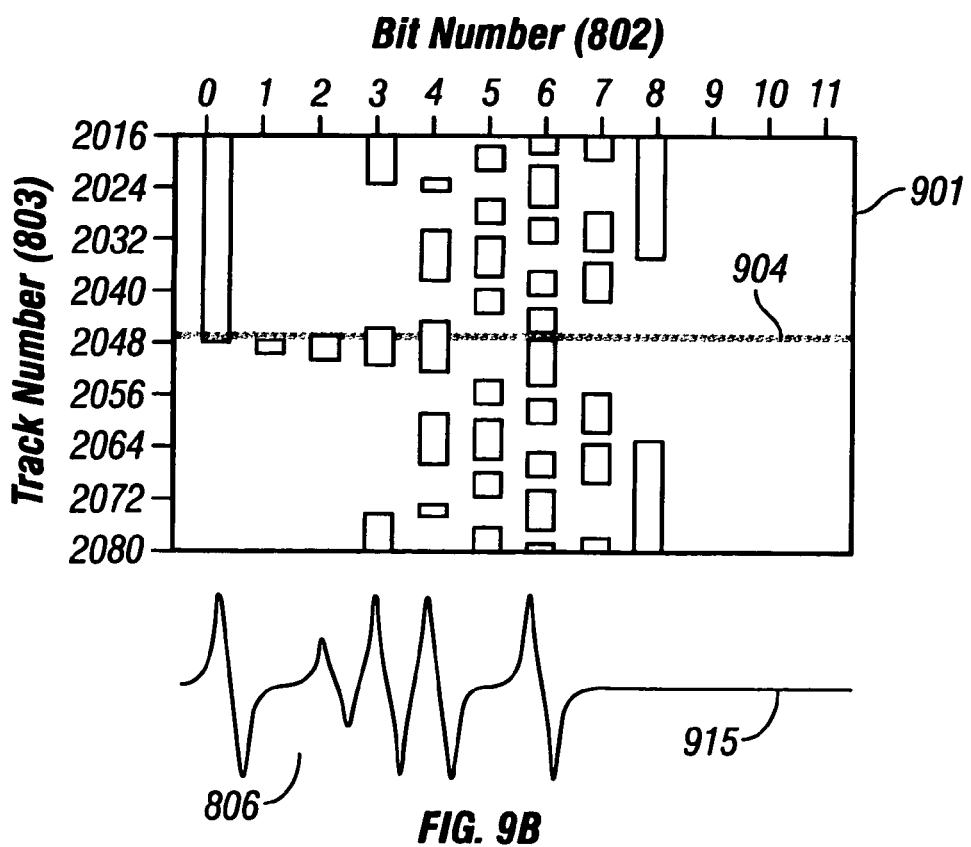
FIG. 9B is an illustration of a read back signal produced by a skewed read head sensing a skew-tolerant Gray code.

FIG. 9B shows how the properties of a skew-tolerant Gray code guarantee reliable performance in this case. The figure shows the Track ID field (901) for a span of 64 tracks of a Gray coded Track ID with 12 bits. The bit number (802) and track number (803) are indicated and the two possible magnetic states of the medium are denoted as black and white. The path of the head across the Track ID field is indicated by a gray stripe (904) and the resulting read-back signal is shown (915). The radial velocity of the head is sufficient that as the head traverses the Track ID field the head reads a portion of three distinct tracks. However in any neighborhood of a few bits the head reads no more than two tracks. Since the code property ensures that the bits which change are located close to each other, there can still be no more than one weak dibit (806) in the resulting read-back signal (915). The resulting ambiguity is thus restricted to only one of two possible values, corresponding to neighboring tracks.

Generating, Encoding and Decoding Skew-tolerant Gray Codes

With reference given to the modified reflective construction method described above for generating skew-tolerant Gray codes, recursive algorithms for automating generation, encoding and decoding of skew-tolerant Gray codes are given in Tables I, II, III, and IV and illustrated in corresponding FIGS. 10A, 10B, 10C, and 10D. These tables and figures represent software embodied as one or more programs of instructions which may be stored in storage media; they also represent the structure of a general purpose digital computer programmed with such software to perform the algorithms, and methods performed by such computers. These tables and figures also represent special purpose processors or ASIC (application-specific integrated circuit) devices designed to execute these algorithms, and methods performed by such devices.

Figure 10A:
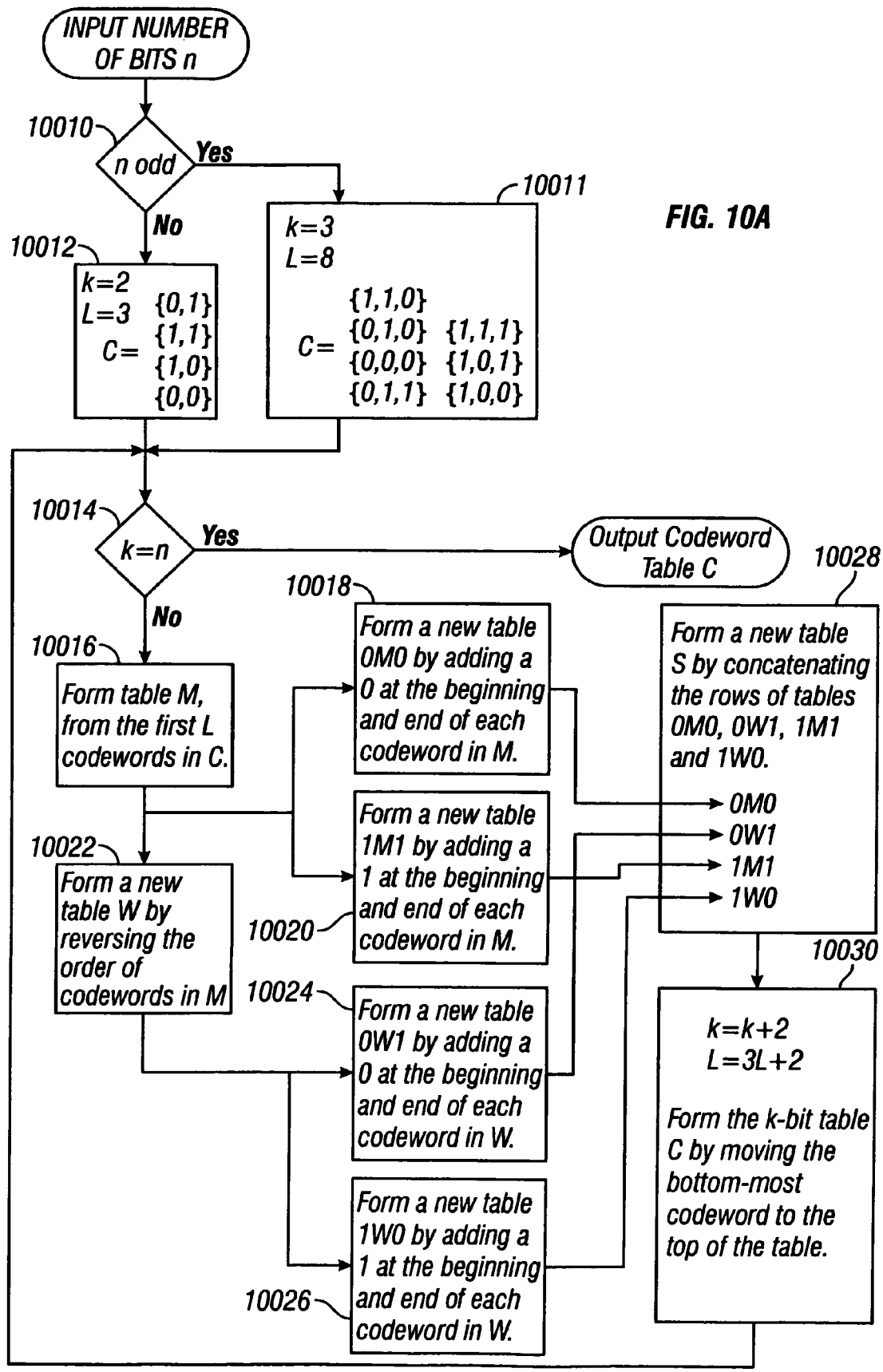
FIG. 10A is a flow chart illustrating recursive generation of a code sequence C(n) for an n-bit skew tolerant Gray code.

Generation of a table C containing a code sequence of n-bit code words is given in the pseudo-code representations of Table I, and is illustrated in FIG. 10A.

TABLE I

Generating a code sequence of n-bit skew-tolerant Gray code code words recursively

```
INPUT:   n, the number of bits in each code word
OUTPUT:  C(n), an ordered list of n-bit code words
if n is odd
    k=2
    L=3
    C = {0,1},{1,1},{1,0},{0,0}
else,
    k=3
    L=8
    C = {1,1,0},{0,1,0},{0,0,0},{0,0,1},{0,1,1},{1,1,1},{1,0,1},{1,0,0}
end if
while k not equal to n
    M    =  the first L code-words in the code table C
    W    =  the table M, modified by reversing the order of the
            code-words
    0M0  =  a table of L n-bit code-words formed by adding a zero
            at the beginning and the end of each n–2 bit codeword in
            table M
    0W1  =  a table of L n-bit code-words formed by adding a zero
            at the beginning and a one at the end of each n–2 bit
            codeword in table W
    1M1  =  a table of L n-bit code-words formed by adding a one
            at the beginning and the end of each n–2 bit codeword in
            table M
    1W0  =  a table of L n-bit code-words formed by adding a one at
            the beginning and a zero at the end of each n–2 bit
            codeword in table W
```

TABLE I-continued

Generating a code sequence of n-bit skew-tolerant Gray code code words recursively S  =  a table of 4L n-bit code-words formed by concatenating the rows in tables 0M0, 0W1, 1M1 and 1W0
    C  =  a table of 4L n-bit code-words formed by removing the last row from Table S and placing it above the first row
    k=k+2
    L=3L+2
end while
output C In Table I and FIG. 10A, a code sequence table M is generated for a skew-tolerant Gray code having code words of length n. First, the number n of co-ordinate positions (bits) is considered in decision 10010. If n is odd, k is initialized to a value of three, the L is initialized to a value of eight, and the table C is initialized to C={1,1,0}, {0,1,0}, {0,0,0}, {0,0,1}, {0,1,1}, {1,1,1}, {1,0,1}, {1,0,0} in step 10011. Otherwise, if n is even, k is initialized to a value of two, the L is initialized to a value of three, and the table C is initialized to C={0,1}, {1,1}, {1,0}, {0,0}. Next, in decision, 10014, the value of k is tested against the value of n. If the values are equal, the positive exit is taken from 10014 and C is returned as the skew-tolerant Gray code. Otherwise, the process enters step 10016, wherein a table M is formed from the first L code words in C. Once step 10016 is completed, three steps are initiated. In step 10018, a new table 0M0 is formed by adding zero at the beginning and end of each code word in M; in step 10020, a new table 1M1 is formed by adding a one at the beginning and end of each code word in M; and in step 10022, a new table W is formed by reversing the order of the code words in M. Then, following step 10022, two steps are initiated. In step 10024, a new table 0W1 is formed by adding a zero at the beginning and a one at the end of each code word in W, while in step 10026, a new table 1W0 is formed by adding a one at the beginning and a zero at the end of each code word in W. Step 10028 uses the results of steps 10018, 10020, 10024, and 10026, concatenating corresponding rows of 0M0, 0W1, 1M1, and 1W0 to form a new table S. Then, in step 10030, S is converted to the table C by moving the bottommost code word to the top row of the table, while the values of k and L are incremented. The process returns to decision 10014, exiting with a code table C with an n-bit skew-tolerant Gray code if k=n, or otherwise looping through step 10016 et seq. until the condition in step 10014 is satisfied.

Encoding and Decoding Skew-Tolerant Gray Codes

Figure 10B:
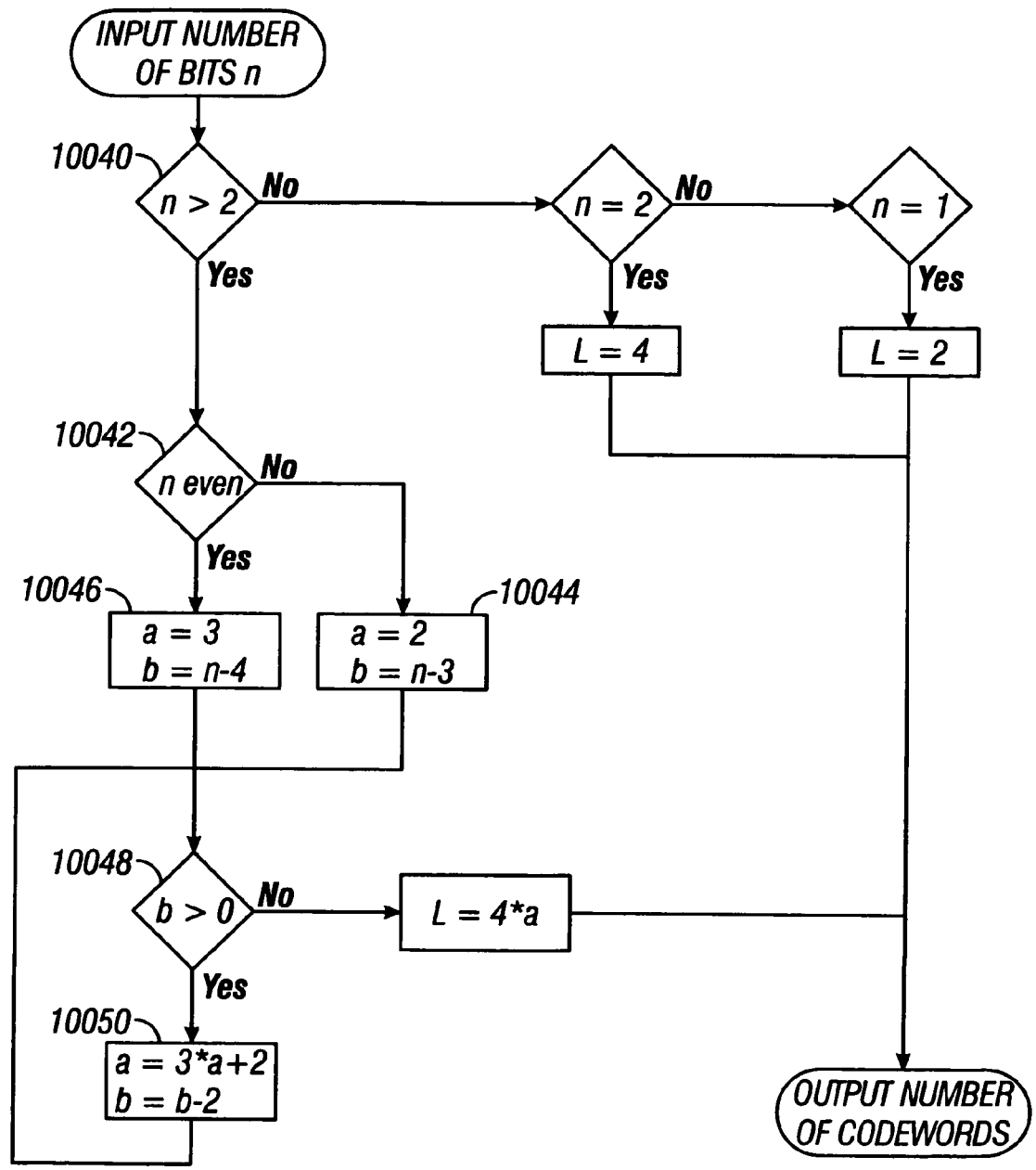
FIG. 10B is a flow chart illustrating computation of the length of the skew-tolerant Gray code sequence C(n)
Figure 10C:
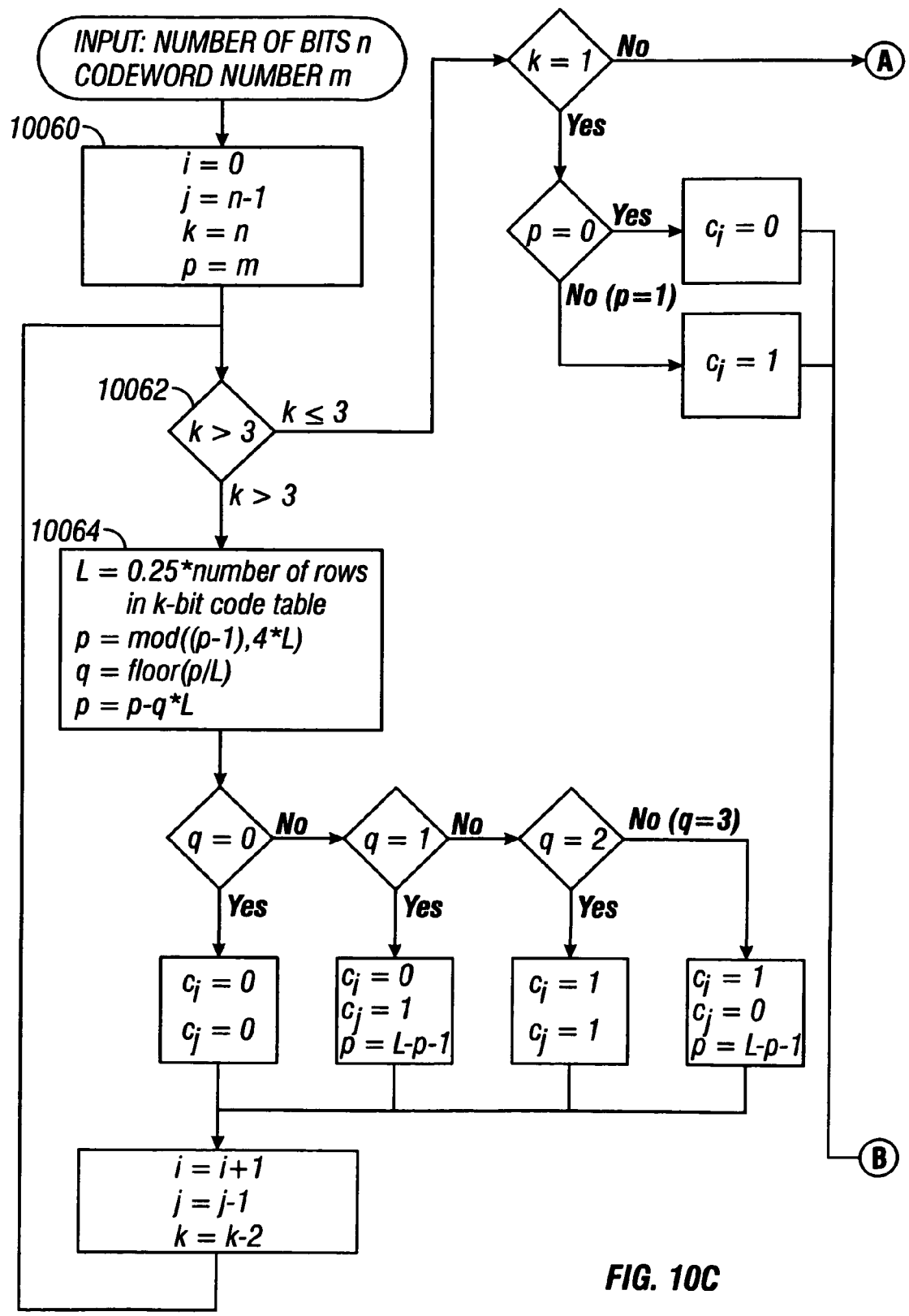
FIG. 10C is a flow chart illustrating encoding a single code word $C_m(n)$ in the skew-tolerant Gray code sequence C(n)
Figure 10C:
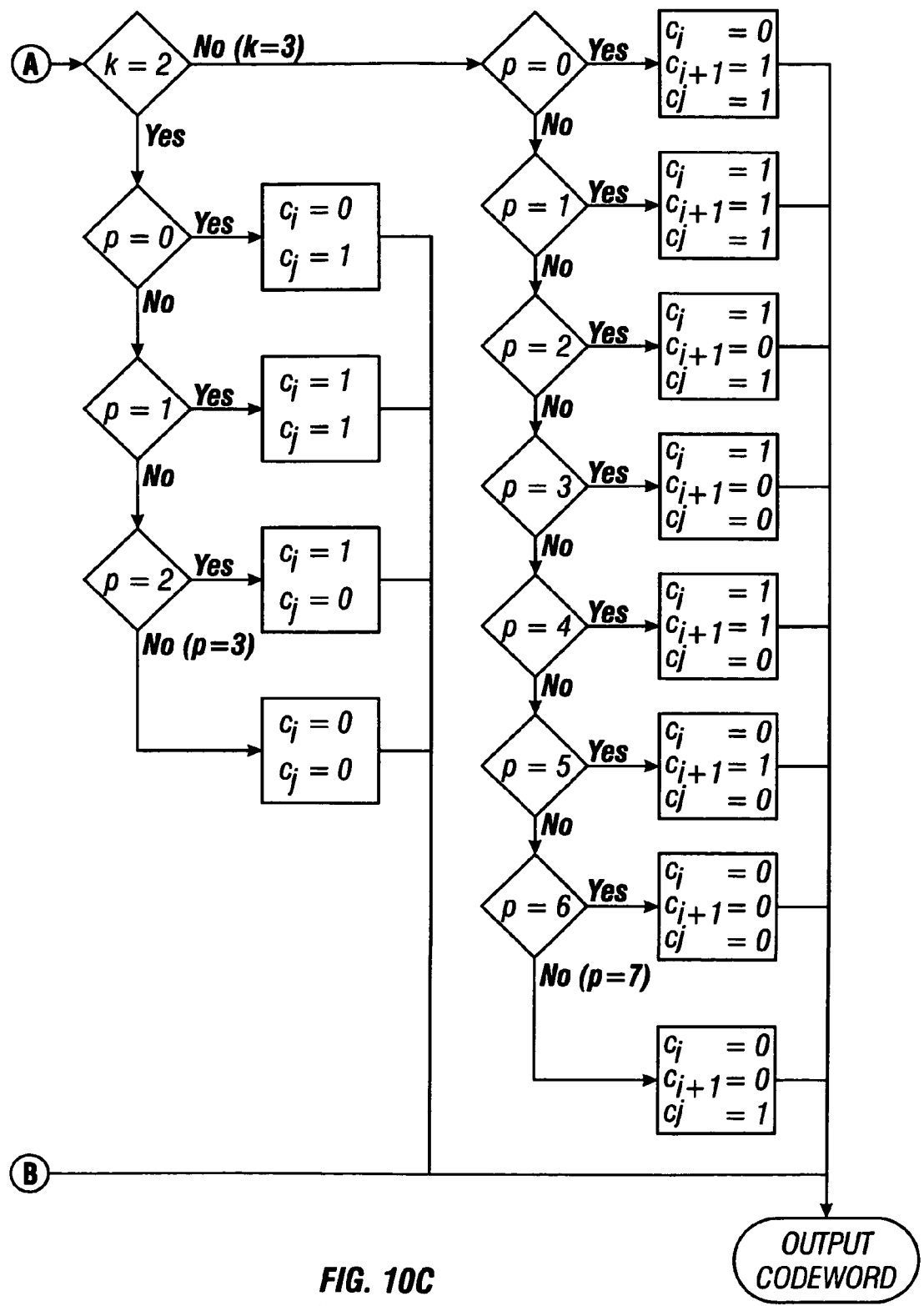
Figure 10D:
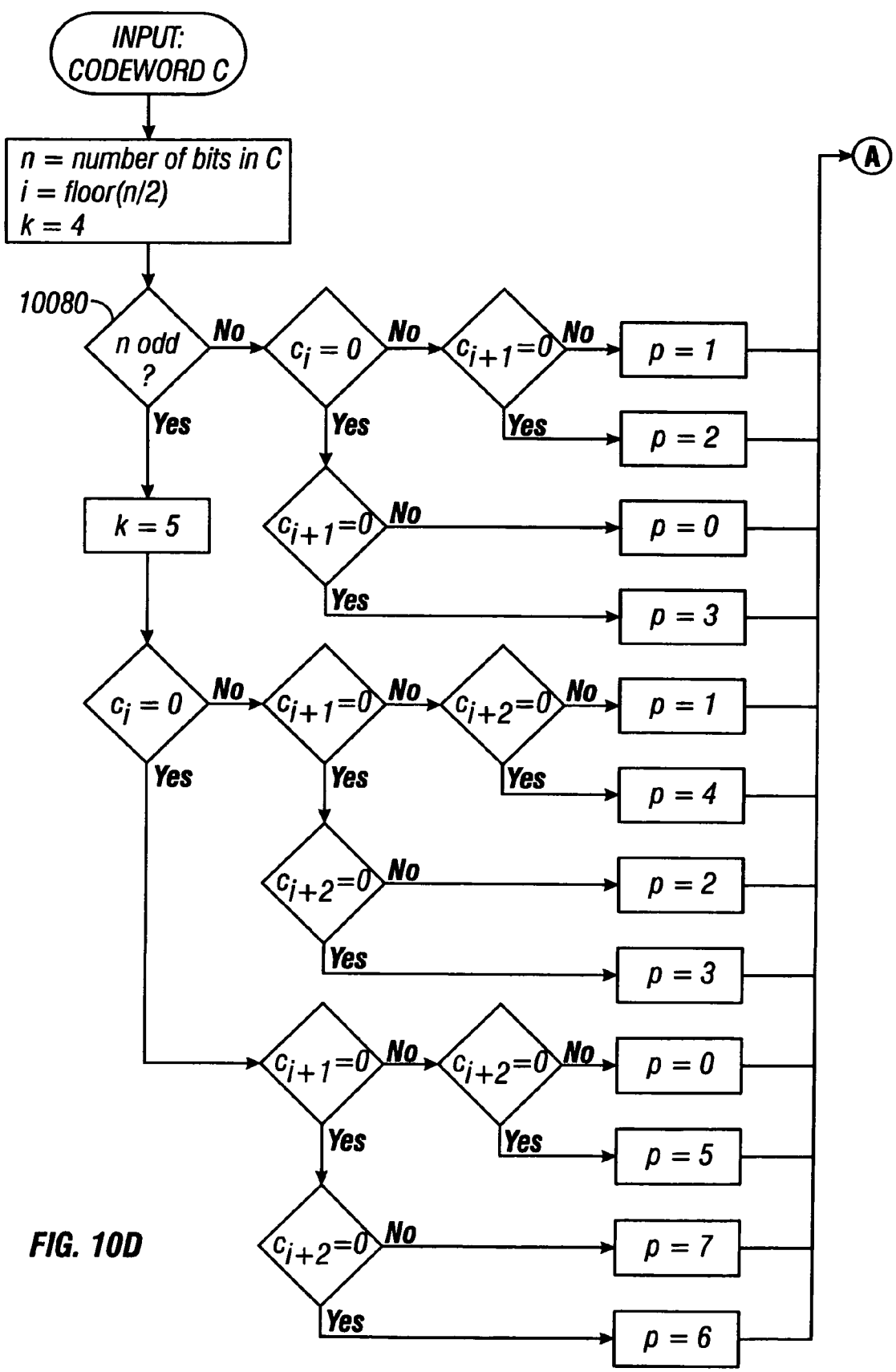
FIG. 10D is a flow chart illustrating decoding c, a single n-bit code word in a skew-tolerant Gray code sequence.
Figure 10D:
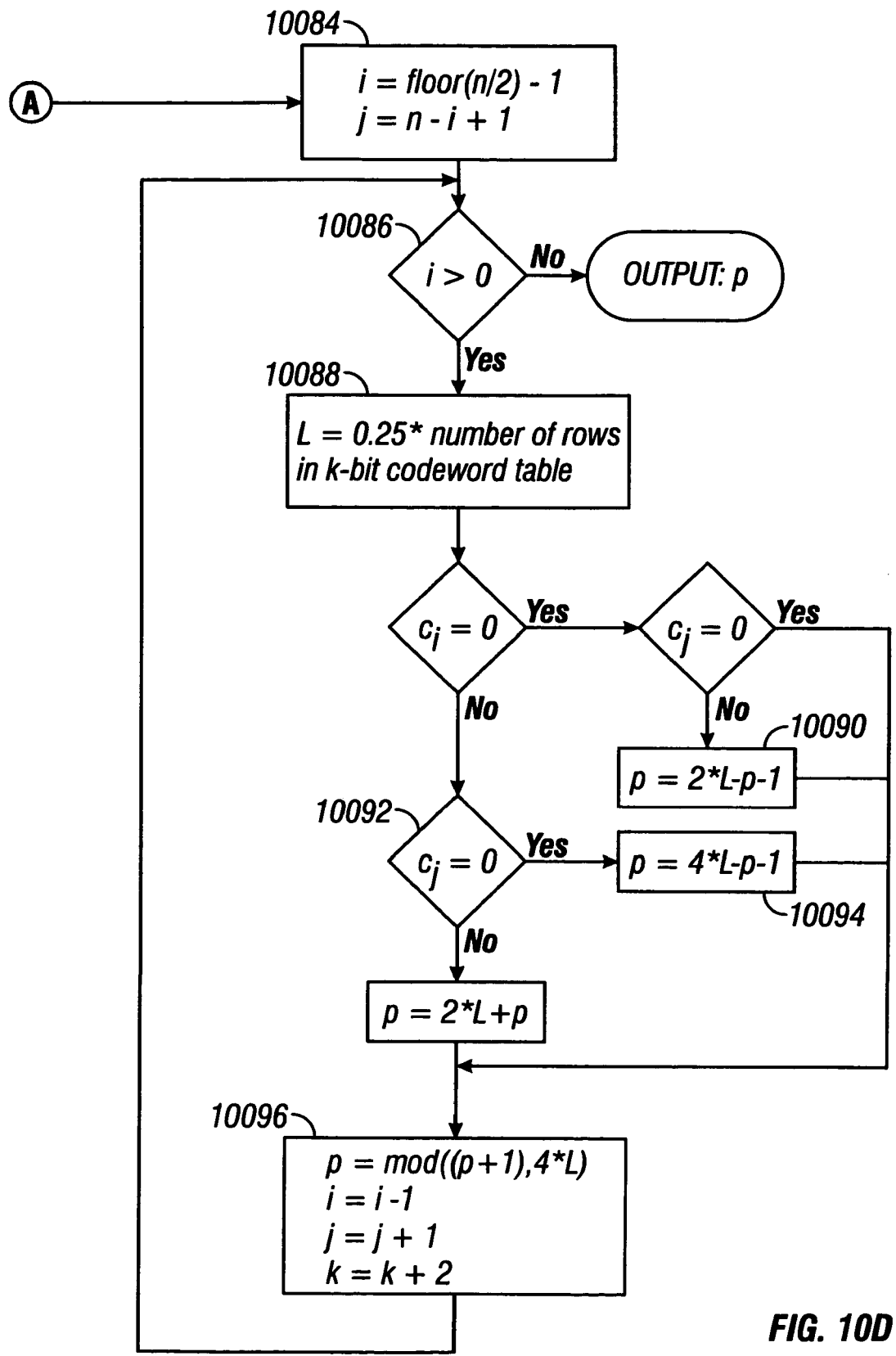

A code sequence table represents a mapping from integer values (row numbers of the table) to strings of binary symbols (code-words in the numbered rows). Encoding is the process of transforming an integer row number into a code word. Decoding is the process of transforming the code word string into the row number. Single code words can be encoded and decoded efficiently without the necessity of constructing and searching the entire code sequence table. The encoding and decoding algorithms to be described rely on the special way the code sequence table is constructed. In this section the operation of the encoding and decoding algorithms is described in general terms. In later sections, Tables II, III and IV and corresponding FIGS. 10B, 10C and 10D are more specifically described.

In the modified reflective construction described above for generating a skew-tolerant code sequence table, each table is built by repeatedly extending and enlarging a smaller codeword table. This process starts with a two (or three) bit codeword table and extends repeatedly by adding a bit at the beginning and end of each code-word. Because of the way the code sequence table is constructed, each code word can be considered to be comprised of a two (or three) bit root code word, extended by adding pairs of bits to the front and back of the code word.

Each code word is decoded by first decoding the root code word. Then by examining the bits that extend the root code word the larger four (or five) bit code word can be decoded. In the next step the process examines the two bits which extend the larger four (or five) bit code word and decodes the six (or seven) bit code word. Continuing to examine extension bits in this way the process decodes progressively larger code words until finally it examines the outermost set of extension bits and decodes the entire code word.

Recall the modified reflective construction as described in Table I and FIG. 10A. As the encoding and decoding algorithms are described, frequent reference will be made to tables M, W, S and C and these should be understood to be the same code sequence tables described in Table I and FIG. 10A. Similarly, reference will be made to quantities L and k which are also described in Table I and FIG. 10A. A process for decoding a skew-tolerant code word uses the table S, which has 4*L rows of code words, each with k+2 bits and is formed by concatenating four smaller tables 0M0, 0W1, 1M1, and 1W0 each with L rows. Now consider that the process has decoded the center k bits of the code word to find the row number p of this code word in table M. The two bits which extend this k-bit code word to make the k+2 bit code word are then examined. If these bits are {0,0} the process is in the first part of S and the row number of the k+2 bit code word in S is also p. If these bits are {0,1} the process is in the second part of S, in which the order of code words in M has been reversed to form W. If the row number of the k-bit code word in M is p then the row number of the same code word in W must be L−p+1 and the row number of the k+2 bit code word in S must be 2*L−p−1. If these bits are {1,1} the process is in the third part of S and the row number of the k+2 bit code word in S is 2*L+p. Finally, if the extension bits are {1,0} the process is in the fourth part of S, in which the order of code words in M has been reversed and the row number of the k+2 bit code word in S must be 4*L−p−1. A code sequence table C is formed as a cyclic shift of code-word table S. Thus if p' is the row number of the k+2 bit code word in S then p'+1 is the corresponding row number of the k+2 bit code word in C unless the k+2 bit codeword is the last row of S (p'=4*L) in which case of the k+2 bit code word is the first row of C. The row number in C becomes the row number in M in the next step as the process examines the next pair of extension bits until the code word is decoded.

The converse approach is used in a process to encode a code word, starting with the outermost extension bits and working inward until the root code word is reached. Consider, for example that the process needs the k+2 bit code word on row p' of code-word table C. This corresponds to row p=p'−1 of table S (unless p'=1 in which case this corresponds to row p=4*L of S). Now, consider the case where p<=L, in which case the process is in the first part of S. Thus the first and last bits of the k+2 bit code word must be {0,0} and the inner k-bits are the pth row of M. For the case where L<p<=2*L, the process is in the second part of S. Thus the first and last bits of the k+2 bit code word must be {0,1} and the inner k-bits are the (p−L)th row of W which is the (2*L+1−p)th row of M. For the case where 2*L<p<=3*L, the process is in the third part of S. Thus the first and last bits of the k+2 bit code word must be {1,1} and the inner k-bits are the (p−2*L)th row of M. For the case where 3*L<p<=4*L, the process is in the fourth part of S. Thus the first and last bits of the k+2 bit code word must be {1,0} and the inner k-bits are the (p−3*L)th row of W which is the (4*L+1−p)th row of M. It is now the case that the values of the outermost pair of extension bits are known and that the row number of the inner k bits in M, the k-bit code-word table, is known. The process continues by encoding this new row number in that smaller code sequence table until k is small enough (two or three bits) that it can be encoded directly.

A recursive algorithm for automating calculation of L, the number of code words in a skew-tolerant Gray code C(n) is given in the pseudo-code representation of Table II, and is illustrated in FIG. 10B. This value may be calculated for use in the encoding and decoding algorithms given below.

TABLE II

Computing the length of C(n) (needed for encoding and decoding)

```
INPUT:      n, the number of bits in each code-word
OUTPUT:     L(n), the number of code-words in C(n)
if n=1
    return L(1) = 2
elseif n=2
    return L(2) = 4
elseif n odd
    a = 2;
    b = n−3;
elseif n even
    a = 3;
    b = n−4;
endif
while b>0
    a = 3*a+2
    b = b−2
end while
return L(n) = 4*a
```

In Table II and FIG. 10B, the value of the parameter L is calculated. In this regard, L is the length of a code sequence in which the code words have n bits. That is to say, L is the number of code words in the sequence. The parameter L is used in the algorithms described below for encoding and decoding code words of a skew-tolerant Gray code. Initially, in decision 10040, the number n of co-ordinate positions (bits) is considered. For a one-bit and two-bit skew-tolerant Gray code, the values of L are simply pre-calculated and stored. Thus, if n=1, L=1 is returned, and if n=2, L=2 is returned. If n>2, the positive exit is taken from decision 10040 and n is tested at 10042 for evenness. If n is even, two recursion parameters, a and b, are initialized to first values in step 10044; if n is odd, the recursion parameters are initialized to second values in step 10046. Then, in decision 10048, for so long as b is non zero, the value of a is incremented and the value of b is decremented in step 10050. When b reaches zero, the value of L is calculated as L=4*a, and this value is returned.

An algorithm for generating a skew-tolerant Gray code word $C_m$ (the mth code word in a particular sequence) without the need to generate the entire table is set forth in Table III and shown in FIG. 10C. In the process which implements this algorithm, the first and last unresolved bits are set to the first and last bits in the code word, i.e. i=0, j=n−1 in step 10060. The unresolved code word size is set to the entire code word, i.e. k=n. The row number in the unresolved code word is set to the code word number, i.e. p=m. In decision 10062, the process tests if the number of unresolved bits is small enough to be encoded directly. If k<=3 the process can encode directly from the 1, 2 or 3 bit code sequence tables. In this case a tree of decision blocks selects the correct values for the root code word bits c(i) through c(j). If k>3 the process must encode a pair of extension bits in step 10064 to reduce the number of unresolved bits. The size (L) of the k-bit code sequence table must be determined. This can be calculated using the method described in the pseudo-code representation of Table II, and is illustrated in FIG. 10B. The k-bit code sequence table is comprised of four equal-sized sections of size L. The value of L is set to one quarter of the size of the k-bit code sequence table. The process then decrements the row number p to reflect the cyclic shift of the codeword table when C is obtained from S in Table I and FIG. 10A. If the decremented value is less than 0 then it is wrapped around to 4*L−1, i.e. the process sets p=mod((p−1),4*L). The process then computes divide p by L and sets q to the quotient and p to the remainder, i.e., q=floor(p/L), p=p−q*L. At this point q indicates in which section of table S the desired row lies and p gives the position of the desired row within that section. Now, depending upon the section of S which is indicated by q the process sets the extension bits to {0,0}, {0,1}, {1,1}, {1,0} when q=0, 1, 2, 3 respectively. If the desired row lies in the second or fourth section (q=1 or q=3) then the process modifies p to reflect that the order of the code words of M are reversed in this section, i.e. p=L−p−1. Now that two extension bits have been determined the process moves the pointers to the unresolved bits in and reduces the number of unresolved bits by two, i.e. i=i+1, j=j−1 and k=k−2. This procedure is repeated until k<=3 and the root codeword can be encoded directly.

TABLE III

```
Encoder
    Generates a single of n-bit code-word
INPUT:    n, the number of bits in each code-word
          m, the ordinal number of the required codeword
OUTPUT:   C_m(n), the m-th codeword in the table of C(n)
initialize c as an array of n bits c(0) through c(n−1)
i = 0
j = n−1
k = n
p = m
while k>3
    L = 0.25*number of rows in C(k)
    p = mod((p−1),4*L)
    q = floor(p/L)
    p = p−q*L
    switch q
        case q = 0
            c(i) = 0
            c(j) = 0
        case q = 1
            p = L−p−1
            c(i) = 0
            c(j) = 1
        case q = 2
            c(i) = 1
            c(j) = 1
        case q = 3
            p = L−p−1
            c(i) = 1
            c(j) = 0
    end switch
    i = i+1
    j = j−1
    k = k−2
end while
switch k
    case k=1
        c(i) = p
    case k=2
        switch p
```

TABLE III-continued

```
            case p =0
                c(i) = 0
                c(j) = 1
            case p =1
                c(i) = 1
                c(j) = 1
            case p =2
                c(i) = 1
                c(j) = 0
            case p =3
                c(j) = 0
                c(i) = 0
            end switch p
    case k=3
        switch p
            case p =0
                c(i) = 0
                c(i+1) = 1
                c(j) = 1
            case p =1
                c(i) = 1
                c(i+1) = 1
                c(j) = 1
            case p =2
                c(i) = 1
                c(i+1) = 0
                c(j) = 1
            case p =3
                c(i) = 1
                c(i+1) = 0
                c(j) = 0
            case p =4
                c(i) = 1
                c(i+1) = 1
                c(j) = 0
            case p =5
                c(i) = 0
                c(i+1) = 1
                c(j) = 0
            case p =6
                c(i) = 0
                c(i+1) = 0
                c(j) = 0
            case p =7
                c(i) = 0
                c(i+1) = 0
                c(j) = 1
            end switch p
    end switch k
    return c
```

An algorithm for decoding a single skew-tolerant Gray code word is set forth in Table IV and shown in FIG. 10D. A decoding process implementing this algorithm tests the number of bits in codeword C in step 10080. If the number of bits is even, a two-bit mother code is utilized. In this case, the center two bits are decoded directly using a tree of decision blocks to obtain the row number p of the root codeword. The size of the next largest codeword table is set to 4, i.e. k=4. If the number of bits is odd, a three-bit mother code is utilized. In this case the center three bits are decoded directly using a tree of decision blocks to obtain the row number p of the root codeword. The size of the next largest codeword table is set to 5, i.e. k=5.

In step 10084, the next extension bit locations are set to the bits adjacent to the root codeword, i.e., i=floor(n/2)−1 and j=n−i+1.

The process next tests in decision 10086 whether all bits have already been decoded by checking the location of the next leading extension bit. If i=0 the process returns p as the decoded row number. If i>0 the process decodes the next pair of extension bits as described below.

The process must determine the size (L) of the k-bit codeword table. This can be calculated using the method described in the pseudo-code representation of Table II, and is illustrated in FIG. 10B. The k-bit code-word table is comprised of four equal-sized sections of size L. In step 10088, L is set to one quarter of the size of the k-bit codeword table.

It is known that p is the row number of the central k−2 bits in the k−2 bit code-word table. The process now tests the pair of extension bits and updates p to be the row number of the central k bits in the k-bit code-word table. Process then starts by finding the row number of the central k bits in the k-bit table S. If the pair of extension bits are {0,0}, the process is in the first section of the codeword table S and need not modify p. If the pair of extension bits are {0,1}, the process is in the second section of the codeword table S and sets p=2*L−p−1 in step 10090. If the pair of extension bits are {1,1}, the process is in the third section of the codeword table S and sets p=2*L+p in step 10092. If the pair of extension bits are {1,0}, the process is in the fourth section of the codeword table S and sets p=4*L−p−1 in step 10094. The row number is now modified in step 10096 to reflect the cyclic shift from S to C, i.e. p=mod((p+1),4*L). At this point the row number of the central k bits in the k-bit code-word table C has been decoded. Now that the k-bit codeword has been decoded the pointers to the extension bits are moved out and the size of the extended codeword is increased by two, i.e. i=i−1, j=j+1 and k=k+2. This procedure until i=0 and the entire codeword has been decoded.

TABLE IV

```
decoder: decodes a single n-bit code-word
INPUT: c, a single n-bit code word, with n the number of
bits in each code word
OUTPUT: p, the ordinal number of c
n = the number of bits in c
l=floor(n/2)
if n is odd,
    Use 3 bit mother code, Select the middle 3
    bits as the mother codeword
    i = (n−1)/2
    k = 5
    if c(i) = 0
        if c(i+1) = 0
            if c(i+2) = 0
                p=6
            else
                p=7
            end if
        else
            if c(i+2) = 0
                p=5
            else
                p=0
            end if
        end if
    else
        if c(i+1) = 0
            if c(i+2) = 0
                p=3
            else
                p=2
            end if
        else
            if c(i+2) = 0
                p=4
            else
                p=1
            end if
        end if
    end if
else
    If n is even use 2 bit mother code, Select the middle 2
```

TABLE IV-continued

```
    bits as the mother codeword
    i = n/2
    k = 4
    if c(i) = 0
        if c(i+1) = 0
            p=3
        else
            p=0
        end if
    else
        if c(i+1) = 0
            p=2
        else
            p=1
        end if
    end if
    i = floor(n/2) - 1;
    j = n-i+1;
    while i>0
        L = 0.25*number of rows in C(k)
        if c(i)=0
            if c(j)=1
                p = 2*L-p-1
            end if
        else
            if c(j)=0
                p = 4*L-p-1
            else
                p = 2*L+p
            end if
        end if
        p = mod((p+1),4*L);
        i = i-1;
        j = j+1;
        k = k+2
    end while
    return p
```

Figure 11:
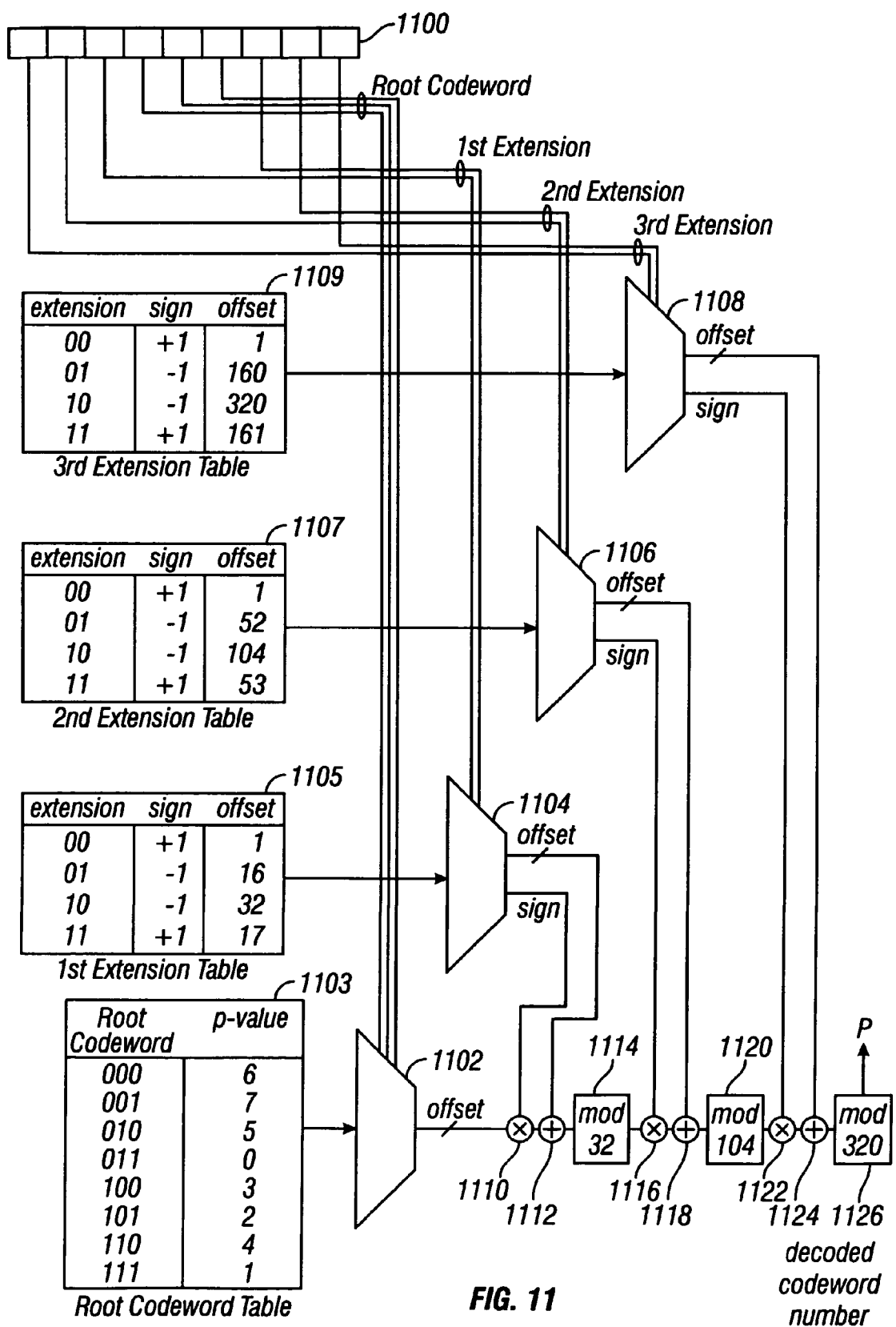
FIG. 11 is a block diagram of a decoder used to decode code words of a nine-bit skew-tolerant Gray code.

FIG. 11 is a block diagram of an exemplary decoder for decoding a nine-bit code word. The decoder represents the specific instance of the flow diagram of FIG. 10D for which n=9. The decoder includes a register 1100 with nine storage locations in which a sensed skew-tolerant Gray code pattern of nine bits is received. A first multiplexer 1102 has control inputs connected to the three central storage locations of the register 1100 and has a data input connected to data storage containing an eight-row table 1103 in which each row contains a table row number (p) indexed by a three-bit root code word. A second multiplexer 1104 has control inputs connected to the two storage locations immediately preceding and following the central storage locations ("the first extension") and has a data input connected to data storage containing a four-row table 1105 in which each row contains a sign and an offset value indexed by a two-bit extension. The second multiplexer 1104 has two outputs; the first for providing the value of the sign and the second for providing the value of the offset in the row indexed in the table 1105 by the current value of the first extension. A third multiplexer 1106 has control inputs connected to the two storage locations immediately preceding and following the first extension locations ("the second extension") and has a data input connected to data storage containing a four-row table 1107 in which each row contains a sign and an offset value indexed by a two-bit extension. The third multiplexer 1106 has two outputs; the first for providing the value of the sign and the second for providing the value of the offset in the row indexed in the table 1107 by the current value of the second extension. A fourth multiplexer 1108 has control inputs connected to the two storage locations immediately preceding and following the second extension locations ("the third extension") and has a data input connected to data storage containing a four-row table 1109 in which each row contains a sign and an offset value indexed by a two-bit extension. The fourth multiplexer 1108 has two outputs; the first for providing the value of the sign and the second for providing the value of the offset in the row indexed in the table 1109 by the current value of the third extension. An arithmetic unit 1110 has a first input connected to the output of the first multiplexer 1102, a second input connected to the first output of the second multiplexer, and an output for providing the product of the p value read from the table 1103 and the sign read from the second table 1105. An arithmetic unit 1112 has a first input connected to the output of the arithmetic unit 1110, a second input connected to the second output of the second multiplexer 1104, and an output for providing the sum of a product produced by the arithmetic unit 1110 and the offset value read from the second table 1105. An arithmetic unit 1114 has an input connected to the output of the arithmetic unit 1112 and an output for providing a remainder having the value of the sum produced by the arithmetic unit 1112 mod 32. An arithmetic unit 1116 has a first input connected to the output of the arithmetic unit 1114, a second input connected to the first output of the third multiplexer 1106, and an output for providing the product of the remainder produced by the arithmetic unit the 1114 and the sign read from the third table 1107. An arithmetic unit 1118 has a first input connected to the output of the arithmetic unit 1116, a second input connected to the second output of the third multiplexer 1106, and an output for providing the sum of a product produced by the arithmetic unit 1116 and the offset value read from the third table 1107. An arithmetic unit 1120 has an input connected to the output of the arithmetic unit 1118 and an output for providing a remainder having the value of the sum produced by the arithmetic unit 1118 mod 104. An arithmetic unit 1122 has a first input connected to the output of the arithmetic unit 1120, a second input connected to the first output of the fourth multiplexer 1108, and an output for providing the product of the remainder produced by the arithmetic unit the 1120 and the sign read from the fourth table 1109. An arithmetic unit 1124 has a first input connected to the output of the arithmetic unit 1122, a second input connected to the second output of the fourth multiplexer 1108, and an output for providing the sum of a product produced by the arithmetic unit 1122 and the offset value read from the fourth table 1109. An arithmetic unit 1126 has an input connected to the output of the arithmetic unit 1124 and an output for providing a remainder having the value of the sum produced by the arithmetic unit 1124 mod 320.

The decoder of FIG. 11 operates as follows. First, the nine bits sensed by a sensor array are read corresponding storage locations of the register 1100. The multiplexers effectively divide the nine bits into four sets. The center three bits are denoted as the root code word and then bits are paired off on either side as first, second, and third extensions. The root code word is decoded first to obtain a value for the parameter p. Then, the extensions successively modify the value of p by determining a sign and an offset. The sign is a single bit and the offset is an integer whose binary value comprises no more than nine bits. A sign modifies the value of p before an offset is added, and the result is normalized by division mod x. The output of the decoder is a modified value of p that is used to look up a code word in a nine-bit, skew-tolerant Gray code sequence.

Figure 12:
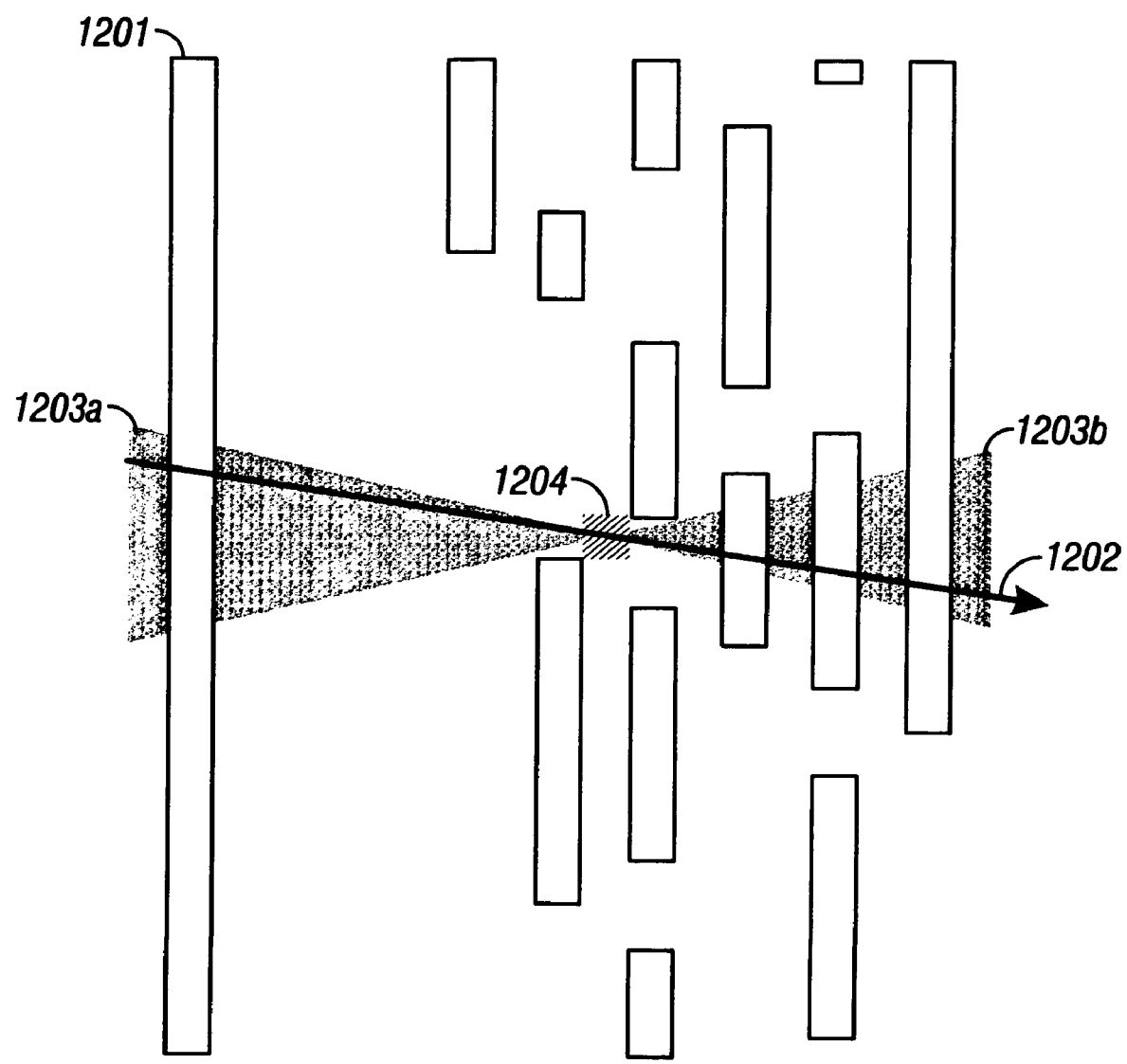
FIG. 12 is a diagram illustrating how the path of a sensor array across a skew-tolerant Gray-coded pattern is localized in two directions.

FIG. 12 illustrates how a skew-tolerant Gray code pattern 1201 permits the path of a sensor array across the pattern to be localized in both the cross-track and down-track directions. Any sensor alignment 1202 across the pattern 1201 will register the same pattern of values, represented in the figure as light and dark bands, provided it lies within the region described by the pair of shaded triangles 1203a and 1203b. Thus, one can associate the code word corresponding to the pattern of values within the composite shaded region 1203a and 1203b, or more concretely, with the hatched region 1204 at the apices of the shaded regions 1203a and 1203b. That is, for each code word, one can identify a small region in the array of the pattern 1201 that the sensor array must have passed through. In the field of hard disk drives, this is a useful property since, by locating a head precisely in two successive servo fields, an accurate estimate of head velocity can be made.

Figure 13:
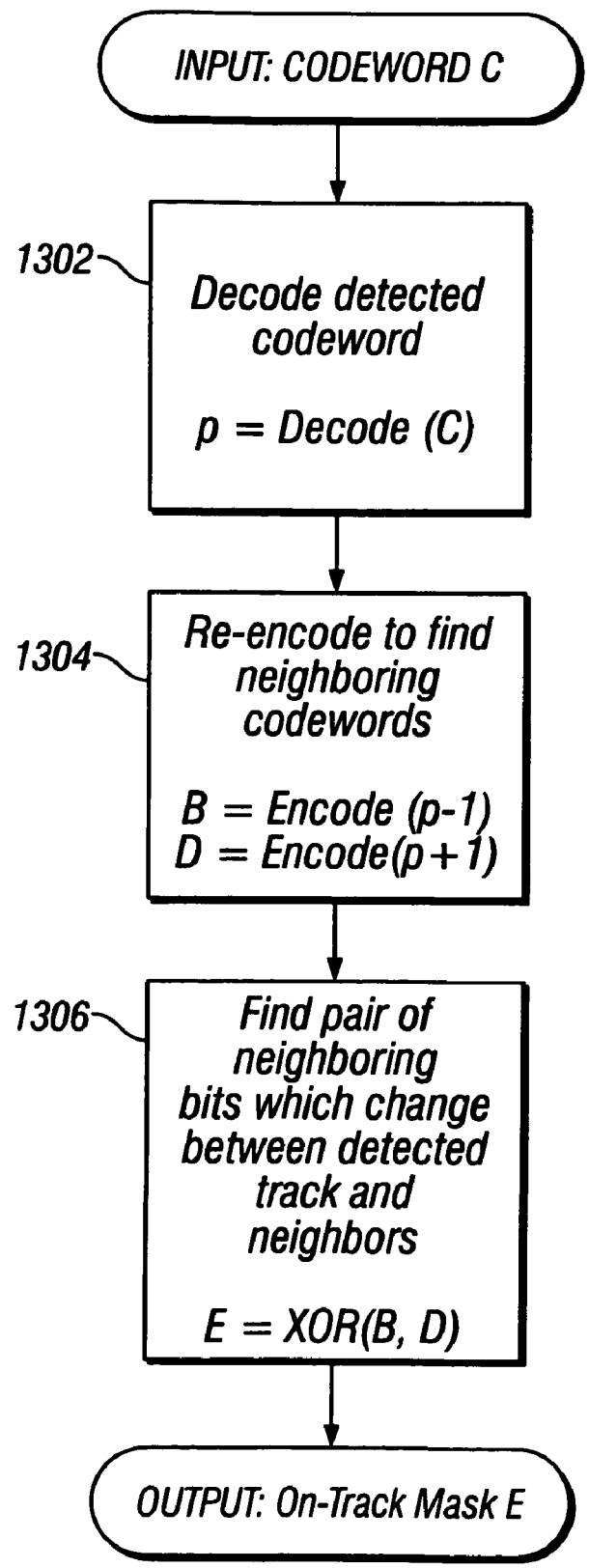
FIG. 13 is a flow diagram illustrating how the region of FIG. 12 is found.

FIG. 13 shows one procedure for finding the region 1204 of FIG. 6. First, the code word is decoded using the procedure of FIG. 10D in step 1302. Then in step 1304, neighboring code words are found using the method of FIG. 10C. These three code words differ only in a pair of adjacent bits. The sensor must have been over the track corresponding to the detected code word for this pair of bits. The bit pair is found in step 1306 by the exclusive-OR combination of the neighboring code words and the bit pair effectively identifies a region ("on-track mask E") one track wide and two bits long that the sensor must have passed over.

Although the invention has been described with reference to the presently preferred embodiment, it should be understood that various modifications can be made without departing from the spirit of the invention. Accordingly, the invention is limited only by the following claims.

We claim:

1. An apparatus for decoding a code word of a skew-tolerant Gray code sequence, comprising:
   a first selector responsive to a root code word in the code word for selecting an initial code sequence position p;
   at least a second selector responsive to an extension of the root code word in the code word for selecting sign and offset values with which to adjust p;
   at least one arithmetic unit for combining the sign value with p to produce a signed value of p;
   at least one arithmetic unit for combining the signed value of p with the offset value to produce an interim value of p; and
   at least one arithmetic unit for performing a modulo calculation of the interim value of p to produce an adjusted value of p.

2. The apparatus of claim 1, further including a lookup table associating root code words with respective values of p, wherein the first selector includes a multiplexer having a control input for receiving a root code word and a data input for receiving a value of p from the table which is associated with the root code word received by the control input.

3. The apparatus of claim 2, further including at least one lookup table associating extensions of the root code word with sign and offset values, wherein the at least a second selector includes a multiplexer having a control input for receiving an extension of the root code word and a data input for receiving sign and offset values from the at least one lookup table which are associated with the extension.

4. The apparatus of claim 1, wherein the skew-tolerant Gray code sequence is coded by a binary Gray code derived from an n-bit binary Gray code $C^n$, in which:
   an n+2 bit binary Gray code $C^{n+2}$ is generated using $C^n$, the binary Gray code $C^{n+2}$ having 4M code words $c''_0$ through $c''_{N-1}$, where N is less than or equal to $2^n$ and being generated by:
   changing the leftmost bit between the code words $c''_0$ and $c''_1$;
   finding the largest value M such that the rightmost bit changes between code words $c''_{M-2}$ and $c''_{M-1}$; and
   forming 4M code words of $C^{n+2}$ by extending the first M code words of $C^n$ by a single bit at each end, with reversals in the order of the code words of $C^n$ as required to yield an extended code X, wherein:

$$x_k^{n+2} = \begin{cases} [0, \; c_k^n, \; 0], & 0 < k \leq M \\ [0, \; c_{M-k+1}^n, \; 1], & M < k \leq 2M \\ [1, \; c_k^n, \; 1], & 2M < k \leq 3M \\ [1, \; c_{M-k+1}^n, \; 0], & 3M < k \leq 4M \end{cases}$$

5. The apparatus of claim 4, wherein the n-bit binary code is a single bit binary code.

6. The apparatus of claim 4, wherein the n-bit binary code is a two-bit binary code.

7. The apparatus of claim 6, wherein the two bit binary code is given by a code table having four code words in the order {01}, {11}, {10}, {00}.

8. The apparatus of claim 7, wherein the n-bit binary code is a three-bit binary code.

9. The apparatus of claim 8, wherein the three bit binary code is given by a code table having eight code words in the order {110}, {010}, {000}, {001}, {011}, {111}, {101}, {100}.

10. An apparatus for generating a skew-tolerant Gray code from an n-bit binary Gray code $C^n$, comprising:
   means for using $C^n$ to generate an n+2 bit binary Gray code $C^{n+2}$ having 4M code words $c''_0$ through $c''_{N-1}$, where N is less than or equal to $2^n$, by:
   means for changing the leftmost bit between the code words $c''_0$ and $c''_1$;
   means for finding the largest value M such that the rightmost bit changes between code words $c''_{M-2}$ and $c''_{M-1}$; and
   means for forming 4M code words of $C^{n+2}$ by extending the first M code words of $C^n$ by a single bit at each end, with reversals in the order of the code words of $C^n$ as required to yield an extended code X, wherein:

$$x_k^{n+2} = \begin{cases} [0, \; c_k^n, \; 0], & 0 < k \leq M \\ [0, \; c_{M-k+1}^n, \; 1], & M < k \leq 2M \\ [1, \; c_k^n, \; 1], & 2M < k \leq 3M \\ [1, \; c_{M-k+1}^n, \; 0], & 3M < k \leq 4M \end{cases}$$

11. The apparatus of claim 10, wherein the n-bit binary code is a single bit binary code.

12. The apparatus of claim 10, wherein the n-bit binary code is a two-bit binary code.

13. The apparatus of claim 12, wherein the two bit binary code is given by a code table having four code words in the order {01}, {11}, {10}, {00}.

14. The apparatus of claim 10, wherein the n-bit binary code is a three-bit binary code.

15. The apparatus of claim 14, wherein the three bit binary code is given by a code table having eight code words in the order {110}, {010}, {000}, {001}, {011}, {111}, {101}, {100}.

16. A coding system, comprising:
an encoder for generating a skew-tolerant Gray code from an n-bit binary Gray code $C^n$, the encoder comprising:
means for using $C^n$ to generate an n+2 bit binary Gray code $C^{n+2}$ having 4M code words $c''_0$ through $c''_{N-1}$, where N is less than or equal to $2^n$, by:
means for changing the leftmost bit between the code words $c''_0$ and $c''_1$;
means for finding the largest value M such that the rightmost bit changes between code words $c''_{M-2}$ and $c''_{M-1}$; and
means for forming 4M code words of $C^{n+2}$ by extending the first M code words of $C^n$ by a single bit at each end, with reversals in the order of the code words of $C^n$ as required to yield an extended code X, wherein:

$$x_k^{n+2} = \begin{cases} [0, c_k^n, 0], & 0 < k \leq M \\ [0, c_{M-k+1}^n, 1], & M < k \leq 2M \\ [1, c_k^n, 1], & 2M < k \leq 3M \\ [1, c_{M-k+1}^n, 0], & 3M < k \leq 4M \end{cases}$$

a decoder for decoding code words of a skew-tolerant Gray code sequence, comprising:
a first selector responsive to a root code word in the code word for selecting an initial code sequence position p;
at least a second selector responsive to an extension of the root code word in the code word for selecting sign and offset values with which to adjust p;
at least one arithmetic unit for combining the sign value with p to produce a signed value of p;
at least one arithmetic unit for combining the signed value of p with the offset value to produce an interim value of p; and
at least one arithmetic unit for performing a modulo calculation of the interim value of p to produce an adjusted value of p.

17. The program medium of claim 16, wherein the n-bit binary code is a single bit binary code.

18. The program medium of claim 10, wherein the n-bit binary code is a two-bit binary code.

* * * * *